(12) United States Patent
Park

(10) Patent No.: US 12,422,466 B2
(45) Date of Patent: Sep. 23, 2025

(54) BONDING QUALITY TEST METHOD, BONDING QUALITY TEST CIRCUIT, AND MEMORY DEVICE INCLUDING BONDING QUALITY TEST CIRCUIT

(71) Applicant: Samsung Electronics Co., Ltd., Suwon-si (KR)

(72) Inventor: Sangsu Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 18/474,470

(22) Filed: Sep. 26, 2023

(65) Prior Publication Data

US 2024/0255564 A1 Aug. 1, 2024

(30) Foreign Application Priority Data

Feb. 1, 2023 (KR) ............... 10-2023-0013682

(51) Int. Cl.
| | | |
|---|---|---|
| *G11C 7/00* | (2006.01) | |
| *G01R 31/26* | (2020.01) | |
| *G11C 16/04* | (2006.01) | |
| *G11C 16/16* | (2006.01) | |
| *H01L 23/00* | (2006.01) | |
| *H01L 25/065* | (2023.01) | |
| *H01L 25/18* | (2023.01) | |
| *H10B 80/00* | (2023.01) | |

(52) U.S. Cl.
CPC ...... *G01R 31/2637* (2013.01); *G11C 16/0483* (2013.01); *G11C 16/16* (2013.01); *H01L 24/08* (2013.01); *H01L 25/0657* (2013.01); *H01L 25/18* (2013.01); *H10B 80/00* (2023.02); *H01L 2224/08145* (2013.01); *H01L 2924/1431* (2013.01); *H01L 2924/14511* (2013.01)

(58) Field of Classification Search
CPC ....... G11C 7/1051; G11C 7/1078; G11C 7/22; G11C 7/106; G11C 7/1057
USPC .................... 365/201, 203, 189.05
See application file for complete search history.

(56) References Cited

U.S. PATENT DOCUMENTS 7,682,962 B2  3/2010 Hembree
9,601,211 B1 * 3/2017 Yang ................ G11C 16/26
(Continued)

FOREIGN PATENT DOCUMENTS

CN 113488452 A 10/2021
KR 20220005036 A 1/2022

*Primary Examiner* — Son T Dinh
(74) *Attorney, Agent, or Firm* — Wolf, Greenfield & Sacks, P.C.

(57) ABSTRACT

A bonding quality test circuit includes a switching circuit configured to provide a connection between a sensing node and a bonding node, the bonding node corresponding to a first end of a bonding resistor that is between a line provided to a memory device and a peripheral circuit, a precharging circuit configured to provide a precharge voltage to the line and the sensing node when the precharging circuit is connected to the line and the sensing node by the switching circuit, a latch circuit that includes a first node configured to provide a control output signal to the precharging circuit and a second node configured to have a voltage that is phase inverted with respect to a voltage of the control output signal, and a first transistor configured to provide an output signal according to the sensing node when the first transistor is connected to the second node.

20 Claims, 23 Drawing Sheets

(56) References Cited

U.S. PATENT DOCUMENTS

| | | |
|---|---|---|
| 11,031,308 B2 | 6/2021 | Lee et al. |
| 11,049,776 B2 | 6/2021 | Jung |
| 11,387,154 B2 | 7/2022 | Oh |
| 2022/0285233 A1 | 9/2022 | Li et al. |
| 2022/0320044 A1 | 10/2022 | Chuang et al. |

* cited by examiner

BONDING QUALITY TEST METHOD, BONDING QUALITY TEST CIRCUIT, AND MEMORY DEVICE INCLUDING BONDING QUALITY TEST CIRCUIT

CROSS-REFERENCE TO RELATED APPLICATION

This application claims priority to and the benefit of Korean Patent Application No. 10-2023-0013682 filed in the Korean Intellectual Property Office on Feb. 1, 2023, the entire contents of which are incorporated herein by reference.

BACKGROUND

The present disclosure relates to a bonding quality test method, a bonding quality test circuit, and a memory device including the bonding quality test circuit.

A bonding-vertical (BV) memory device may include an upper plate formed by stacking memory cells and a lower plate formed of peripheral circuits. When the upper and lower plates are bonded, there is a limit to test the bonding quality of the connection between the wiring of the lower plate and a lower bonding metal and the connection between a bit line, a common source line, and the like of the upper plate and an upper bonding metal. There is a method to check the bonding quality by using the result of reading data of a cell array after erasing the cell array, but this may be possible only under the condition where the cell array manufacturing process is completed (Full Loop, F/L). That is, the bonding quality may not be tested under the condition where the cell array is not manufactured (Short Loop, S/L). Misalign (M/A) and void may occur in the bonding between the upper and lower plates. Due to this, the bonding resistance may be greater than a target resistance value. When the on-cell resistance increases as the bonding resistance becomes several to several tens of Megaohms, the reliability of the bonding quality test using the cell array in F/L may also deteriorate.

SUMMARY

The present disclosure has been made in an effort to provide a test method and circuit capable of detecting high-resistance defects and open defects of bonding in a bit line direction without using a cell array, and evaluating a bonding quality in the same way in Short Loop (S/L) and Full Loop (F/L). The present disclosure has also been made in an effort to provide a memory device capable of checking a bonding progress defect by using the corresponding test method.

A bonding quality test circuit configured to test a bonding between a line provided to a memory device and a peripheral circuit that drives the memory device according to aspects of the present disclosure includes: a switching circuit configured to provide an electrical connection between a sensing node and a bonding node, the bonding node corresponding to a first end of a bonding resistor that is between the line and the peripheral circuit; a precharging circuit configured to provide a precharge voltage to the line and the sensing node when the precharging circuit is electrically connected to the line and the sensing node by the switching circuit; a latch circuit that includes a first node configured to provide a control output signal to the precharging circuit and a second node configured to have a voltage that is phase inverted with respect to a voltage of the control output signal; and a first transistor configured to provide an output signal according to the sensing node when the first transistor is electrically connected to the second node of the latch circuit.

The bonding quality test circuit may further include: a second transistor electrically connected between the first end of the bonding resistor and the bonding node; and a third transistor electrically connected between the bonding node and a ground.

When the switching circuit electrically connects the precharging circuit, the bonding node, and the sensing node to each other in a state where the second transistor is on and the third transistor is off, the precharging circuit may be configured to provide the precharge voltage to the line and the sensing node.

When the switching circuit blocks the precharging circuit from the bonding node and the sensing node and electrically connects the bonding node to the sensing node in a state where the second transistor is off and the third transistor is on, the sensing node may be configured to discharge.

After the sensing node is discharged, the second transistor may be configured to turn on and the third transistor may be configured to turn off such that the sensing node and the first end of the bonding resistor may be electrically connected, and after the second transistor is turned on and the third transistor is turned off, the first transistor may be configured to provide the output signal according to a voltage of the sensing node.

The line of the memory device may be a bit line or a cell contact plug-in electrically connected to a word line of the memory device.

The memory device may be on a first semiconductor layer, and the peripheral circuit may be on a second semiconductor layer, and the bonding quality test circuit may be in the second semiconductor layer.

The bonding quality test circuit may be configured to operate before a memory cell is formed in the first semiconductor layer.

A memory device according to aspects of the present disclosure includes: a first semiconductor layer that includes a plurality of memory cells and a bit line electrically connected to one or more of the plurality of memory cells; and a second semiconductor layer that includes a page buffer circuit electrically connected to the bit line through a bonding metal. The page buffer circuit may include: a switching circuit configured to provide an electrical connection between a sensing node and a bonding node, the bonding node corresponding to a first end of the bonding metal; a precharging circuit configured to provide a precharge voltage to the bit line and the sensing node when the precharging circuit is electrically connected to the bit line and the sensing node by the switching circuit; a latch circuit that includes a first node configured to provide a control output signal to the precharging circuit and a second node configured to have a voltage that is phase inverted with respect to a voltage of the control output signal; and a first transistor configured to provide an output signal according to the sensing node when the first transistor is electrically connected to the second node of the latch circuit.

The page buffer circuit may further include: a second transistor electrically connected between the first end of the bonding metal and the bonding node; and a third transistor electrically connected between the bonding node and a ground.

When the switching circuit electrically connects the precharging circuit, the bonding node, and the sensing node to each other in a state where the second transistor is on and the third transistor is off, the precharging circuit may be configured to provide the precharge voltage to the bit line and the sensing node.

When the switching circuit blocks the precharging circuit from the bonding node and the sensing node and electrically connects the bonding node to the sensing node in a state where the second transistor is off and the third transistor is on, the sensing node may be configured to discharge.

After the sensing node is discharged, the second transistor may be configured to turn on and the third transistor may be configured to turn off such that the sensing node and the first end of the bonding metal may be electrically connected.

After the second transistor is turned on and the third transistor is turned off, the first transistor may be configured to provide the output signal according to a voltage of the sensing node.

The memory device may further include a control logic circuit configured to: receive an erase command as a defense code for a block that includes the plurality of memory cells; control the page buffer circuit to electrically connect the bonding node and the sensing node to the precharging circuit during a precharging period; discharge the sensing node during a discharging period after the precharging period; and electrically connect the bonding metal to the bonding node and electrically connect the bonding node to the sensing node after the discharging period.

An operation cycle of the block may include an erase operation performed on the block based on the erase command, and a number of times of the operation cycle of the block may be based on a predetermined operation limit cycle.

When a bonding quality of the bonding metal is in a normal state, the bit line may be configured to share a charge with the sensing node after the discharging period and the first transistor may be configured to provide the output signal at a first voltage level. When the bonding quality of the bonding metal is in an abnormal state, the first transistor may be configured to provide the output signal at a second voltage level different from the first voltage level.

A method of testing bonding of layers of a memory device, the layers comprising a first semiconductor layer on which a memory cell is formed and a second semiconductor layer bonded to the first semiconductor layer by a bonding metal and on which a peripheral circuit for driving the memory cell is formed according to aspects of the present disclosure includes: receiving an erase command for a block including a plurality of memory cells; determining whether a number of times of an operation cycle of the block has reached a predetermined operation limit cycle; electrically connecting, when the number of times of the operation cycle of the block reaches the operation limit cycle, a sensing node to a bonding node and providing a precharge voltage to the sensing node and the bonding node during a precharging period, the bonding node corresponding to a first end of the bonding metal; discharging the sensing node during a discharging period after the precharging period; and electrically connecting the bonding node and the bonding metal and electrically connecting the bonding node and the sensing node after the discharging period.

The discharging of the sensing node may include blocking the bonding node from the bonding resistor.

The bonding quality test method may further include determining a bonding quality of the bonding metal as a normal state or an abnormal state based on an output signal generated according to a voltage of the sensing node after the discharging period.

DETAILED DESCRIPTION

Figure 1:
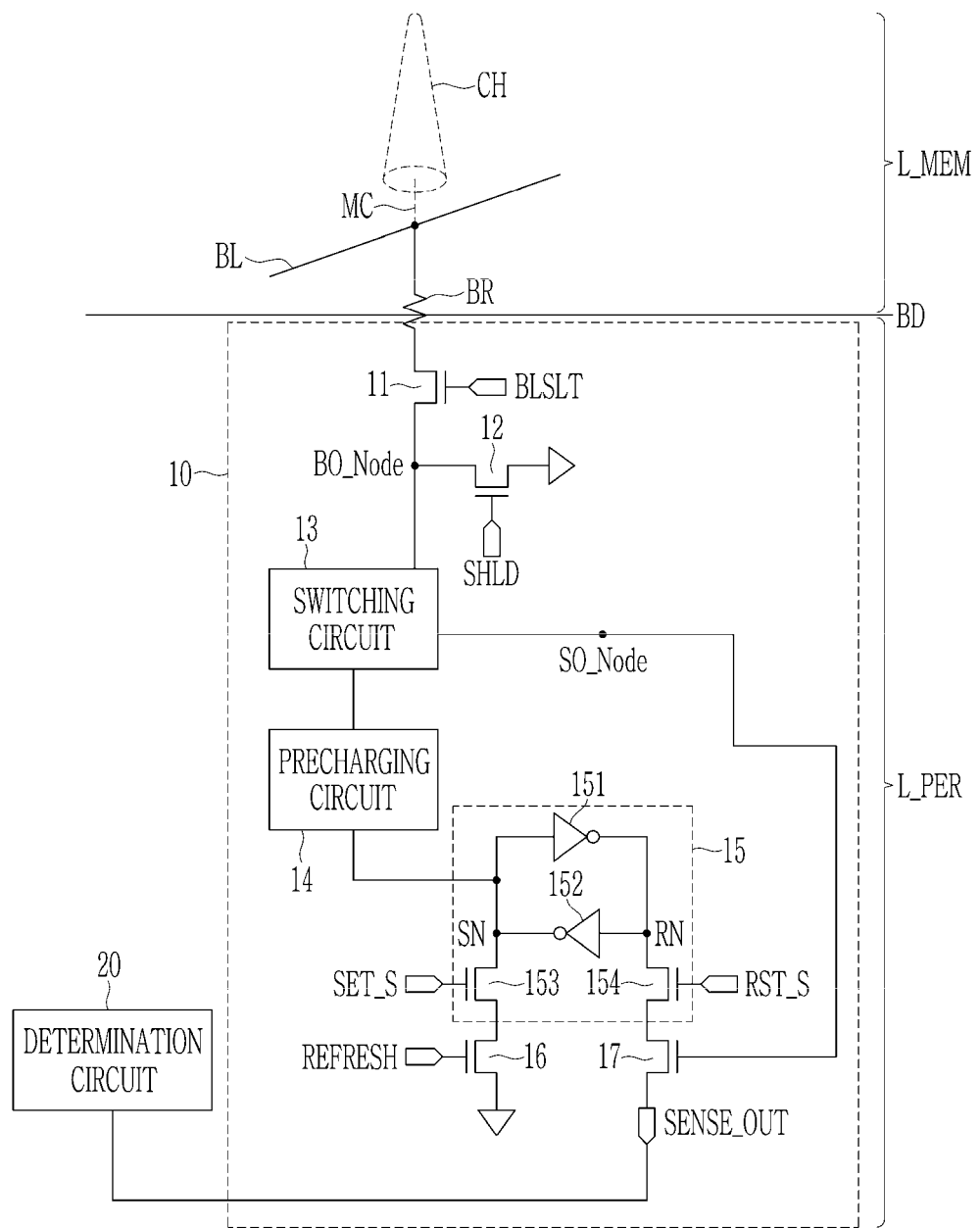
FIG. 1 is a circuit diagram illustrating a bonding quality test circuit according to some embodiments.

In the following detailed description, example embodiments of the present disclosure have been illustrated and described, simply by way of illustration. As those skilled in the art would realize, the described example embodiments may be modified in various different ways, all without departing from the scope of the present disclosure.

Accordingly, the drawings and description are to be regarded as illustrative in nature and not restrictive. Like reference numerals designate like elements throughout the specification. In the flowchart described with reference to the drawing, the order of operations may be changed, several operations may be merged, some operations may be divided, and specific operations may not be performed.

In addition, expressions written in the singular may be construed in the singular or plural unless an explicit expression such as "a" or "single" is used. Terms including an ordinary number, such as first and second, are used for describing various constituent elements, but the constituent elements are not limited by the terms. These terms may be used for the purpose of distinguishing one component from another.

As used herein, the terms "comprises", "comprising", "includes", "including", "has", "having" and any other variations thereof specify the presence of the stated features, steps, operations, elements, and/or components, but do not preclude the presence or addition of one or more other features, steps, operations, elements, components, and/or groups thereof.

In the present disclosure, in a structure in which a first semiconductor layer including a memory device (for example, NAND memory) and a second semiconductor layer including a peripheral circuit for driving the memory device are vertically stacked by bonding metal (hereinafter referred to as the "Bonding Vertical (BV)) structure"), a charge sharing operation may be performed between the first semiconductor layer and the second semiconductor layer through bonding, and a bonding quality may be tested by measuring a result of the charging sharing. The bonding quality may be determined by bonding metal. Specifically, high-resistance defects and open defects for bonding metal may be detected through the corresponding test. In the BV structure, a page buffer may be used to detect bonding defects. In the manufacturing process of the BV structure, the degree of charge sharing between the first semiconductor layer and the second semiconductor layer may be detected by using the page buffer of the second semiconductor layer in both the condition where the cell array is not formed and the condition where the cell array is formed. The lower the bonding quality, the greater the bonding resistance, so the degree of charge sharing may be low or may not occur. The page buffer provides a signal indicating the degree of charge sharing, and bonding defects may be detected according to the corresponding signal.

In the life management period of the memory device, the operation of detecting the degree of charge sharing described in the previous paragraph may be performed by a page buffer in order to detect progressive open and resistive defects. For example, when a memory controller provides a certain command to a memory device in a life management mode for a block that satisfies a certain condition according to a defense code, the memory device may perform a bonding quality test operation on the corresponding block along with the operation according to the corresponding command. In this case, the certain condition includes a case where the number of times of the operation cycles of the corresponding block reaches a predetermined operation limit cycle, and the corresponding command may be an erase command. The defense code may refer to software implementing an algorithm that slows down or prevents a decrease in lifespan of the memory device due to use by a user. The defense code may be implemented through firmware in the memory controller. Defense code may be divided into prevention technology and recovery technology. Prevention technology is a technology that preemptively protects memory devices from deteriorating, and may include garbage collection (block management), wear leveling (pursuing uniform deterioration), read reclaim (predicting the degree of deterioration in advance and transcribing the predicted degree of deterioration to prevent defects), and the like. The technology of extending the lifespan by using variable parameters according to the Program-Erase (PE) cycle may also be classified as a wide range of prevention defense codes. The recovery technique may include a technique of reducing an error when an Error Correction Code (ECC) circuit fails in error correction, or making the ECC circuit succeed in error correction. For example, the recovery defense code may be a technique of reducing the number of errors by moving the read level to an optimal position when the number of errors increases due to a wrong read level.

FIG. 1 is a circuit diagram illustrating a bonding quality test circuit according to some embodiments.

In FIG. 1, a first semiconductor layer L_MEM on which a memory cell is to be formed and a second semiconductor layer L_PER on which a peripheral circuit is to be formed are stacked based on a boundary BD, and a bonding metal providing electrical connection between the first semiconductor layer L_MEM and the second semiconductor layer L_PER on which a peripheral circuit is to be formed is indicated by a bonding resistor BR. In FIG. 1, the channel structure CH connected to the bit line BL is indicated by a dashed line. Under a condition in which the channel structure CH is not formed, the bit line BL may not be connected to the channel structure CH. Under a condition in which the channel structure CH is formed, the bit line BL may be connected to the channel structure CH through a metal electrode MC. The bonding resistor BR may be the sum of the resistance of the bonding metal of the first semiconductor layer L_MEM on which the bit line BL is formed and the resistance of the bonding metal of the second semiconductor layer L_PER on which the bonding quality test circuit 10 is formed.

The test circuit 10 may include a plurality of transistors 11, 12, 16, and 17, a switching circuit 13, a precharging circuit 14, and a latch circuit 15.

The transistor 11 may be connected between the bonding resistor BR and the bonding node BO_Node, and a bit line selection signal BLSLT may be supplied to a gate of the transistor 11. The bonding node BO_Node may correspond to a first end of the bonding resistor BR that is between the second semiconductor layer L_PER and the bit line BL. For example, the transistor 11 may be electrically connected between the first end of the bonding resistor BR and the bonding node BO_Node. The transistor 11 may perform a switching operation according to the bit line selection signal BLSLT. The transistor 12 may be connected (e.g., electrically connected) between the bonding node BO_Node and the ground, and a shielding signal SHLD may be supplied to a gate of the transistor 12. The transistor 12 may perform a switching operation according to the shielding signal SHLD.

The switching circuit 13 may be connected between the bonding node BO_Node, the sensing node SO_Node, and the precharging circuit 14 to provide connection between the precharging circuit 14 and the bonding node BO_Node, connection between the precharging circuit 14 and the sensing node SO_Node, and connection between the bonding node BO_Node and the sensing node SO_Node according to the bonding quality test operation. For example, the switching circuit 13 may provide an electrical connection between the precharging circuit 14 and the bonding node BO_Node, an electrical connection between the precharging circuit 14 and the sensing node SO_Node, and an electrical connection between the bonding node BO_Node and the sensing node SO_Node according to the bonding quality test operation.

The precharging circuit 14 may recharge the bit line BL and the sensing node SO_Node when connected to the bonding node BO_Node and the sensing node SO_Node through the switching circuit 13. For example, when the switching circuit 13 connects (e.g., electrically connects) the precharging circuit 14, the bonding node BO_Node, and the sensing node SO_Node to each other in a state where the transistor 11 is on and the transistor 12 is off, the precharging circuit 14 may provide a precharge voltage to the bit line BL and the sensing node SO_Node. As used herein, "in a state where a transistor is off" (or similar language) may mean that the transistor acts similarly to an open switch and allows little to no current to flow therethrough. As used herein, "in a state where a transistor is on" (or similar language) may mean that the transistor acts similarly to a closed switch and allows current to flow substantially therethrough.

The latch circuit 15 includes two inverters 151 and 152 and two transistors 153 and 154, and may determine an output (e.g., a control output signal) according to a set signal SET_S and a reset signal RST_S and may control an operation of the precharging circuit 14. Each of the two inverters 151 and 152 is implemented in CMOS, and an input terminal of the inverter 151 is connected to the node SN, an output terminal of the inverter 151 is connected to the node RN, an input terminal of the inverter 152 is connected to the node RN, and an output terminal of the inverter 152 is connected to the node SN. One end of the transistor 153 is connected to the node SN, the other end of the transistor 153 is connected to one end of the transistor 16, and the set signal SET_S may be supplied to the gate of the transistor 153. One end of the transistor 154 is connected to the node RN, the other end of the transistor 154 is connected to one end of the transistor 17, and a reset signal RST_S may be supplied to a gate of the transistor 154. As used herein, "one end" may also be referred to as a first end, and "the other end" may also be referred to as a second end.

The transistor 153 performs a switching operation according to the set signal SET_S to control the voltage of the node SN, and the transistor 154 performs a switching operation according to the reset signal RST_S to control the voltage of the node RN. The voltages of the nodes SN and RN may be latched by the two inverters 151 and 152. The voltage of the node SN may be provided as a control input of the precharging circuit 14. For example, the voltage at the node SN may be provided as a control output signal of the latch circuit 15, and the control output signal may be provided as an input to the precharging circuit 14. In other words, the node SN may be configured to provide a control output signal to the precharging circuit 14. The voltage of the node SN and the voltage of the node RN may have inverted phases. For example, the node RN may have a voltage that is phase inverted with respect to a voltage at the node SN. In other words, the node RN may have a voltage that is phase inverted with respect to a voltage of the control output signal. When the voltage of the node SN is at a high level, the voltage at the node RN may be at a low level, and vice versa. The latch circuit 15 may provide a control output (e.g., a control output signal) according to the voltage of the node SN to the precharging circuit 14.

The other end of the transistor 16 is connected to ground, and a refresh signal REFRESH may be supplied to the gate of the transistor 16. The transistor 16 may provide a ground voltage to the latch circuit 15 according to the refresh signal REFRESH. A gate of the transistor 17 is connected to the sensing node SO_Node, and the transistor 17 may provide an output signal SENSE_OUT to the other end according to the voltage of the sensing node SO_Node. For example, the transistor 17 may provide an output signal SENSE_OUT (e.g., from a second end of the transistor 17) according to the voltage at the sensing node SO_Node when the transistor 17 is electrically connected to the node RN. The output signal SENSE_OUT is an output of the test circuit 10 and may indicate a bonding quality. As the bonding resistor BR increases (e.g., as a resistance of the bonding resistor BR increases), the degree of charge sharing decreases, and thus the voltage of the sensing node SO_Node may decrease. As the voltage of the sensing node SO_Node decreases, the on-resistance of the transistor 17 increases such that the output signal SENSE_OUT may decrease. When the voltage of the sensing node SO_Node is low and the transistor 17 is turned off, the output signal SENSE_OUT may not be generated. The level of the output signal SENSE_OUT when the bonding quality is normal is different from the level of the output signal SENSE_OUT when the bonding quality is abnormal, and in some embodiments, the output signal SENSE_OUT in the normal state may have a higher level than the output signal SENSE_OUT in the abnormal state. As used herein, "a transistor turned off" (or similar language) may mean that the transistor acts similarly to an open switch and allows little to no current to flow therethrough. As used herein, "a transistor turned on" (or similar language) may mean that the transistor acts similarly to a closed switch and allows current to flow substantially therethrough.

The determination circuit 20 may be connected to the test circuit 10 to receive the output signal SENSE_OUT, and determine the state of the bonding quality according to the level of the output signal SENSE_OUT. The determination circuit 20 may determine the bonding quality as a normal state when the voltage level of the output signal SENSE_OUT is equal to or greater than a predetermined reference level. Otherwise, the determination circuit 20 may determine the bonding quality as an abnormal state. The determination circuit 20 may externally display the result of determining the bonding quality state or transmit the result to a higher-order controller or an external component.

Hereinafter, a bonding quality test method using the bonding quality test circuit will be described with reference to FIGS. 2 to 4.

Figure 2:
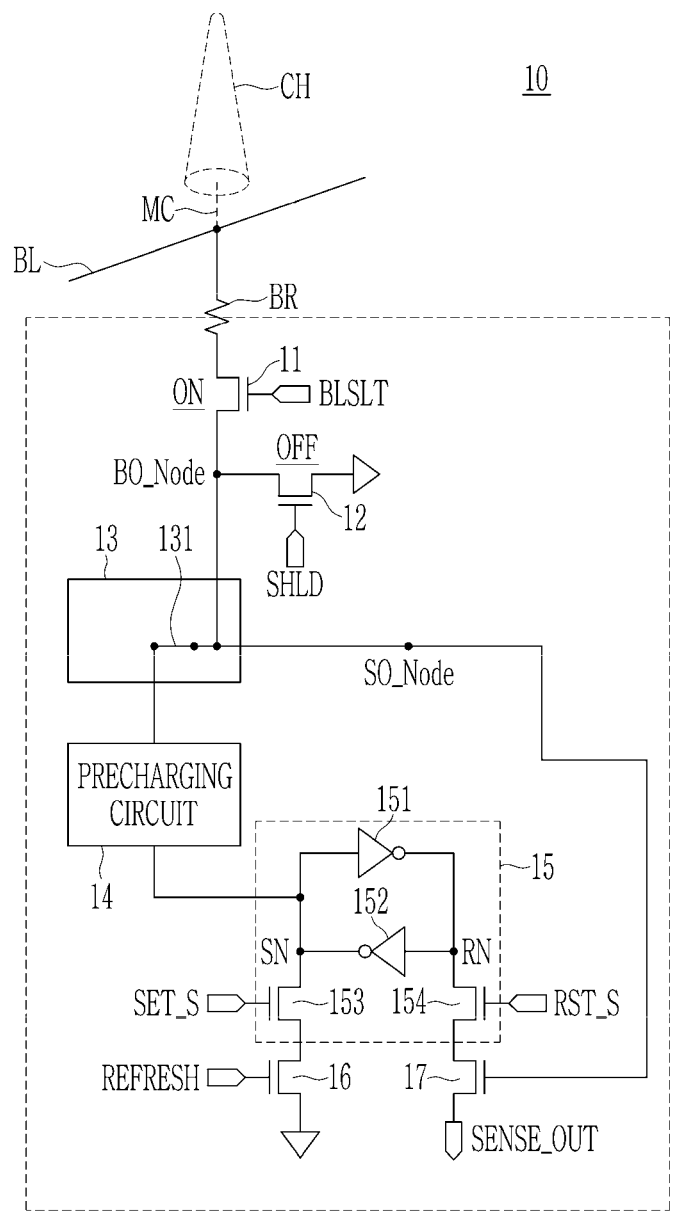
FIG. 2 is a diagram illustrating a circuit when a sensing node and a bit line are precharged by a precharging circuit according to some embodiments.

FIG. 2 is a diagram illustrating a circuit when a sensing node and a bit line are precharged by the precharging circuit according to some embodiments.

The switching circuit 13 includes a switch 131, and the switch 131 is closed during a precharging period in which a precharge voltage is supplied to the bit line BL and the sensing node SO_Node.

The set signal SET_S and the refresh signal REFRESH are provided at an on level (for example, high level) for a predetermined period, so that the voltage of the node SN is set to the on level (for example, high level) enabling the precharging circuit 14. The precharging circuit 14 may operate by the voltage of the node SN to supply a predetermined precharge voltage. Then, the switching circuit 13 connects the precharging circuit 14, the bonding node BO_Node, and the sensing node SO_Node. For example, the switching circuit 13 may electrically connect the precharging circuit 14, the bonding node BO_Node, and the sensing node SO_Node to each other. The transistor 11 is in an on state, and the transistor 12 is in an off state.

Figure 3:
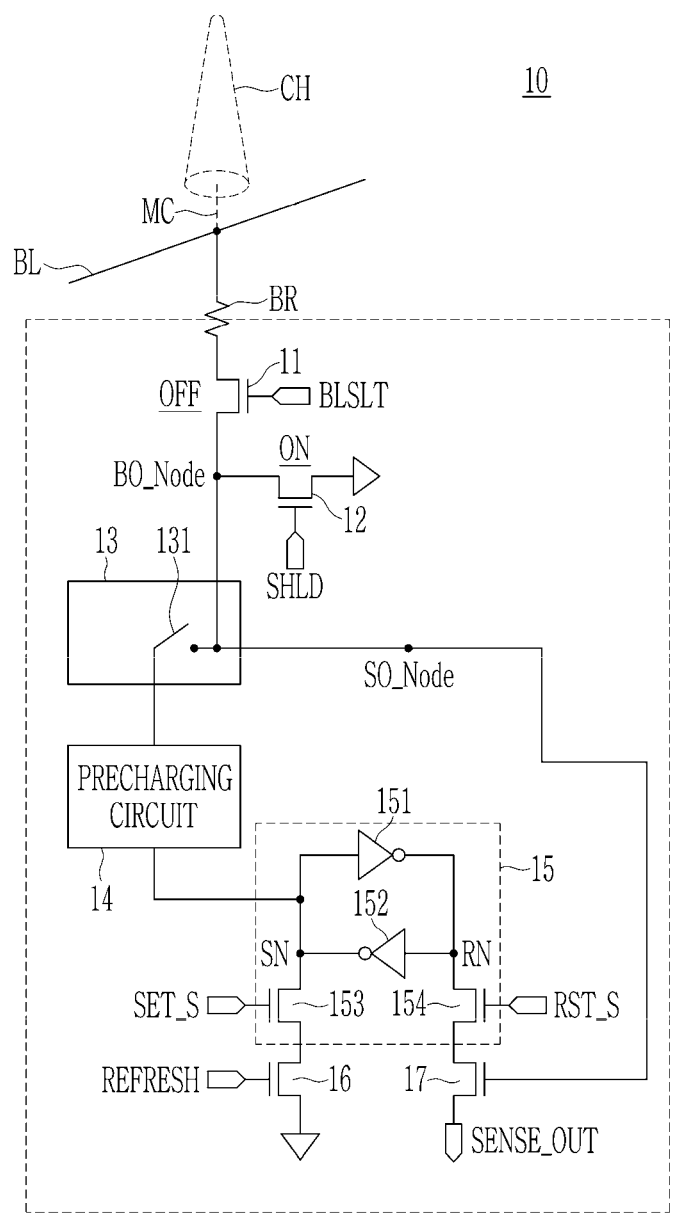
FIG. 3 is a diagram illustrating a circuit when the sensing node is discharged according to some embodiments.

FIG. 3 is a diagram illustrating a circuit when the sensing node is discharged according to some embodiments.

Figure 4:
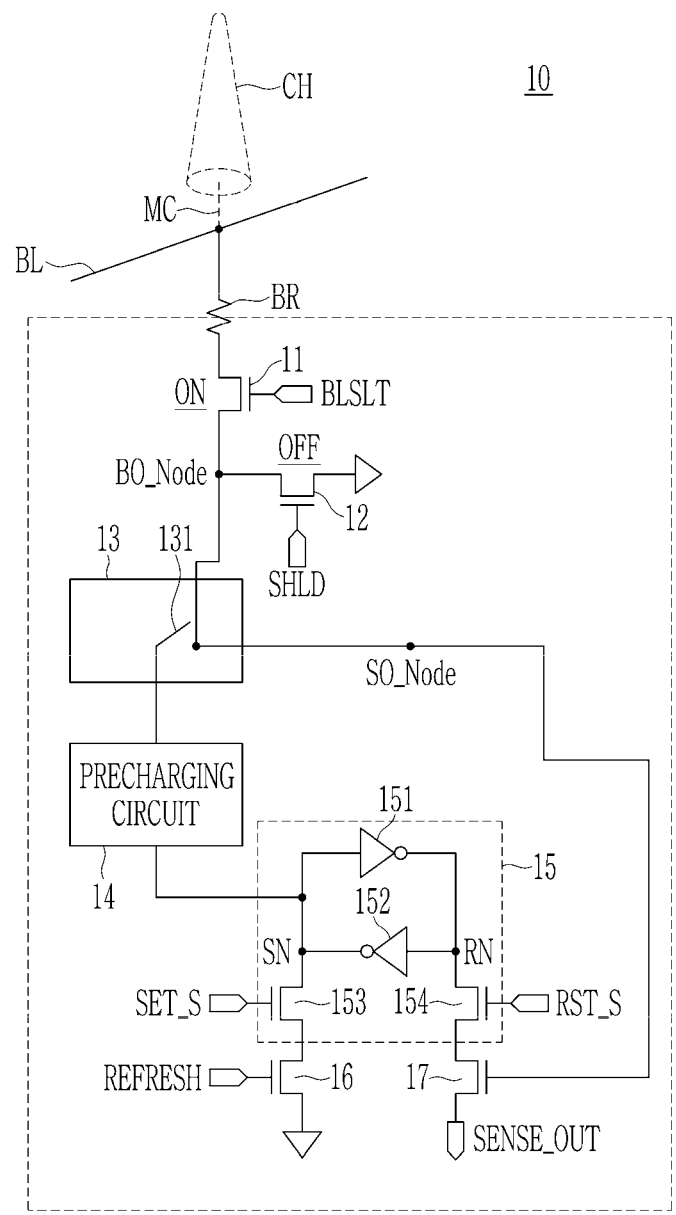
FIG. 4 is a diagram illustrating a circuit when charge sharing between the sensing node and the bit line is performed.

FIG. 4 is a diagram illustrating a circuit when charge sharing between the sensing node and the bit line is performed.

In FIGS. 3 and 4, the switching circuit 13 connects the sensing node SO_Node and the bonding node BO_Node, and blocks the precharging circuit 14 from the sensing node SO_Node and the bonding node BO_Node. As used herein, "an element A blocked from an element B" (or similar language) may mean that little to no current flows from the element A to the element B, or vice versa. The switch 131 is open during the discharging period and the charge sharing period to block the precharging circuit 14.

As illustrated in FIG. 3, during the discharging period of the sensing node SO_Node, the transistor 11 is in an off state and the transistor 12 is in an on state. For example, the bonding node BO_Node may be blocked from the bit line BL and the bonding resistor BR. The sensing node SO_Node may be discharged through the on-state transistor 12. For example, the sensing node SO_Node may discharge the precharge voltage.

As illustrated in FIG. 4, during the charge sharing period, the transistor 11 is in an on state and the transistor 12 is in an off state. Charges accumulated in the bit line BL may be shared with the sensing node SO_Node through the on-state transistor 11. When the reset signal RST_S becomes on-level for a predetermined period after the predetermined charge sharing period ends, the transistor 17 is driven according to the voltage of the sensing node SO_Node during the on-level period to provide an output signal SENSE_OUT. For example, the transistor 17 may provide an output signal SENSE_OUT according to the voltage at the sensing node SO_Node when the reset signal RST_S becomes on-level for a predetermined period after the charge sharing period ends such that the transistor 17 is electrically connected to the node RN. For example, when the bonding quality is in a normal state, the bit line BL may share a charge with the sensing node SO_Node after the discharging period and the transistor 17 may provide the output signal SENSE_OUT at a first voltage level. For example, when the bonding quality is in an abnormal state, the bit line BL may not substantially share a charge with the sensing node SO_Node (e.g., due to a high resistance of the bonding resistor BR) and the transistor 17 may provide the output signal SENSE_OUT at a second voltage level different from the first voltage level. In some embodiments, the first voltage level may be higher than the second voltage level.

The output signal SENSE_OUT provided through the operations illustrated in FIGS. 2 to 4 may vary according to a bonding quality. Hereinafter, the operation illustrated in FIG. 2 is referred to as a precharging period, the operation illustrated in FIG. 3 is referred to as a discharging period, and the operation illustrated in FIG. 4 is referred to as a charge sharing period.

Figure 5:
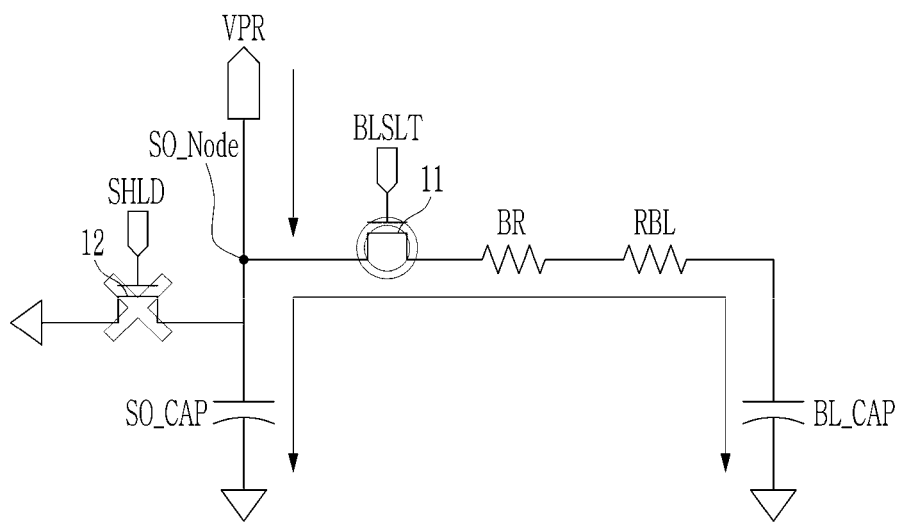
FIG. 5 is a diagram illustrating an equivalent circuit of the bonding quality test circuit in a precharging period when a bonding quality is in a normal state.

FIG. 5 is a diagram illustrating an equivalent circuit of the bonding quality test circuit in the precharging period when a bonding quality is in a normal state.

In FIG. 5, "SO_CAP" represents the capacitance between the sensing node SO_Node and a peripheral configuration that satisfies the metal-insulator-metal condition for the sensing node SO_Node. "BR" is the bonding resistor, "RBL" is the resistance component of the bit line, and "BL_CAP" is the capacitance between the bit line BL and the peripheral configuration that satisfies the metal-insulator-metal condition for the bit line BL. The capacitance BL_CAP of the bit line BL may be much greater than the capacitance SO_CAP of the sensing node SO_Node.

As illustrated in FIG. 5, when the precharge voltage VPR is supplied to the sensing node SO_Node and the bonding quality is in a normal state, the precharge voltage VPR may be supplied to the bit line BL through the on-state transistor 11 and the bonding resistor BR. The capacitance SO_CAP of the sensing node SO_Node may be charged by the precharge voltage VPR supplied to the sensing node SO_Node, and the capacitance BL_CAP of the bit line BL may be charged by the precharge voltage VPR supplied to the bit line BL.

Figure 6:
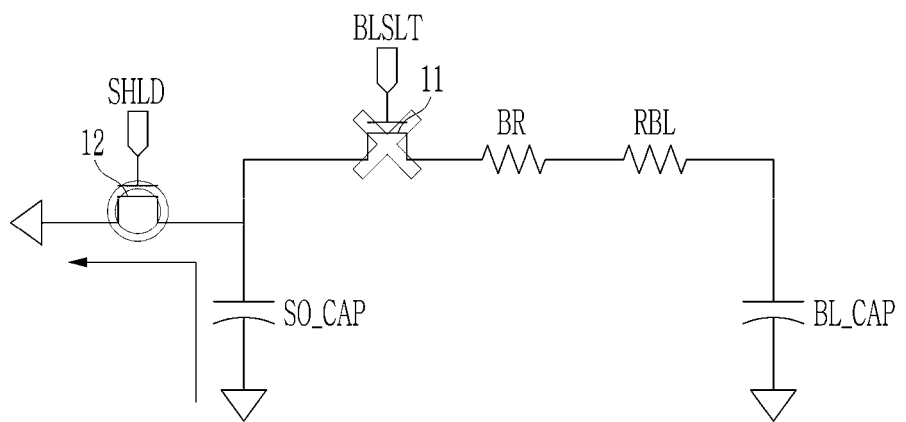
FIG. 6 is a diagram illustrating an equivalent circuit of the bonding quality test circuit in a discharging period when a bonding quality is in a normal state.

FIG. 6 is a diagram illustrating an equivalent circuit of the bonding quality test circuit in the discharging period when bonding quality is in a normal state.

As illustrated in FIG. 6, during the discharging period, the transistor 11 is in an off state, and the capacitance SO_CAP of the sensing node SO_Node may be discharged through the transistor 12 that is in an on state.

Figure 7:
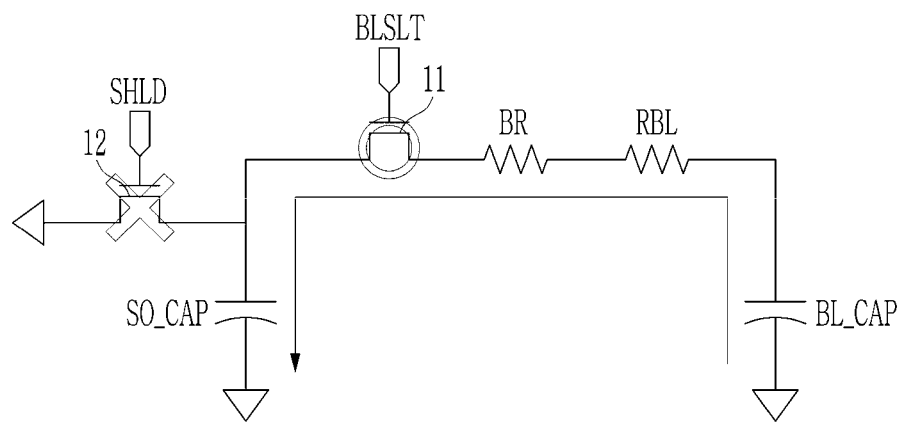
FIG. 7 is a diagram illustrating an equivalent circuit of the bonding quality test circuit in a charge sharing period when a bonding quality is in a normal state.

FIG. 7 is a diagram illustrating an equivalent circuit of the bonding quality test circuit in a charge sharing period when a bonding quality is in a normal state.

As illustrated in FIG. 7, during the charge sharing period, the transistor 12 is in an off state, and the bit line BL and the sensing node SO_Node may be connected through the transistor 11 that is in an on state and the bonding resistor BR. Then, charge sharing may be performed in which the charge of the capacitance BL_CAP of the bit line BL is transferred to the capacitance SO_CAP of the sensing node SO_Node.

When the reset signal RST_S becomes on level after the charge sharing period, the transistor 17 operates according to the voltage of the sensing node SO_Node to provide the output signal SENSE_OUT. In the normal state of the bonding quality, the voltage of the sensing node SO_Node may be charged to a sufficiently high voltage by the charge sharing. Then, the transistor 17 may be turned on to provide an output signal SENSE_OUT according to the voltage level (for example, high level) of the node RN.

Figure 8:
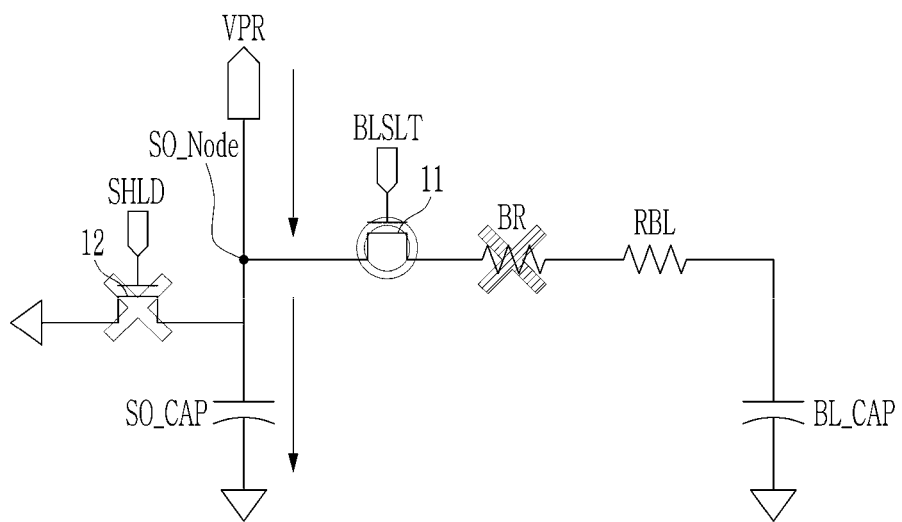
FIG. 8 is a diagram illustrating an equivalent circuit of the bonding quality test circuit in a precharging period when a bonding quality is in an abnormal state.

FIG. 8 is a diagram illustrating an equivalent circuit of the bonding quality test circuit in a precharging period when a bonding quality is in an abnormal state.

The abnormal state of the bonding quality may include a state in which bonding resistance is very high and a case in which bonding is open.

As illustrated in FIG. 8, since the resistance of the bonding resistor BR is very high or open, the capacitance SO_CAP of the sensing node SO_Node is charged by the precharge voltage VPR, but the precharge voltage VPR is not supplied to the bit line BL. Accordingly, the capacitance BL_CAP of the bit line BL is not charged.

Figure 9:
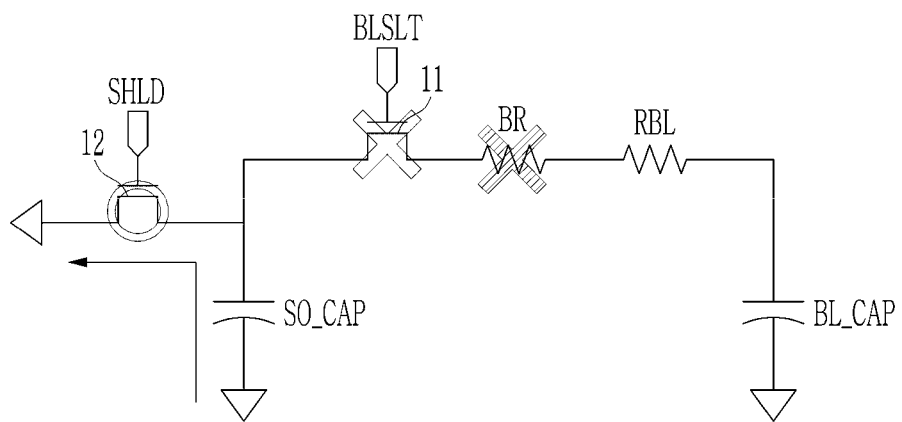
FIG. 9 is a diagram illustrating an equivalent circuit of the bonding quality test circuit in a discharging period when the bonding quality is in an abnormal state.

FIG. 9 is a diagram illustrating an equivalent circuit of the bonding quality test circuit in a discharging period when the bonding quality is in an abnormal state.

As illustrated in FIG. 9, during the discharging period, the transistor 11 is in an off state, and the capacitance SO_CAP of the sensing node SO_Node may be discharged through the transistor 12 in an on state.

Figure 10:
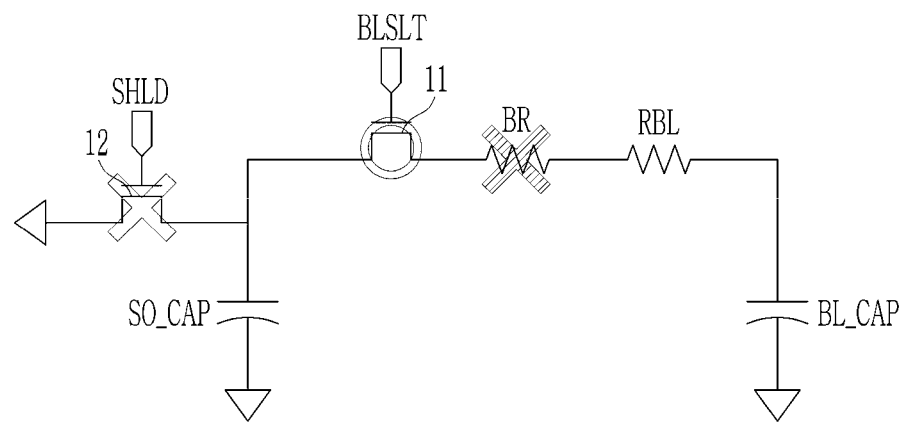
FIG. 10 is a diagram illustrating an equivalent circuit of the bonding quality test circuit in a charge sharing period when a bonding quality is in an abnormal state.

FIG. 10 is a diagram illustrating an equivalent circuit of the bonding quality test circuit in a charge sharing period when a bonding quality is in an abnormal state.

As illustrated in FIG. 10, during the charge sharing period, the transistor 11 is in an on state and transistor 12 is in an off state. However, since the bonding resistance is very large, the bit line BL and the sensing node SO_Node cannot be electrically connected. In addition, because the capacitance BL_CAP of the bit line BL is not charged during the precharging period, even if there is an electrical connection between the bit line BL and the sensing node SO_Node, charge transfer from the capacitance BL_CAP of the bit line BL to the capacitance SO_CAP of the sensing node SO_Node is not performed.

When the reset signal RST_S becomes on level after the charge sharing period, the transistor 17 operates according to the voltage of the sensing node SO_Node to provide the output signal SENSE_OUT. In the abnormal state of the bonding quality, the voltage of the sensing node SO_Node may not be generated or may be at a low level. Then, the transistor 17 is in an off state and no voltage is generated at the node RN, so that the output signal SENSE_OUT cannot be provided. For example, the transistor 17 may be in the off state and may substantially block a signal at the node RN, so that the output signal SENSE_OUT cannot be provided or is provided at a low level.

As such, since the level of the output signal SENSE_OUT changes according to the bonding quality state, the bonding quality may be determined through the level of the output signal SENSE_OUT provided from the bonding quality test circuit 10.

The bonding quality test circuit 10 according to embodiments described above may be applied even after the channel structure CH is formed on the first semiconductor layer. However, under the condition in which the channel structure CH is formed, current may flow through the channel structure CH connected to the bit line BL. When the bit line BL is not sufficiently charged during the precharging period because the current flows to the channel structure CH, charge sharing between the bit line BL and the sensing node SO_Node may be weak. In this case, even though the bonding quality is in a normal state, the voltage of the sensing node SO_Node is low and the bonding quality may be determined to be in an abnormal state.

Figure 11:
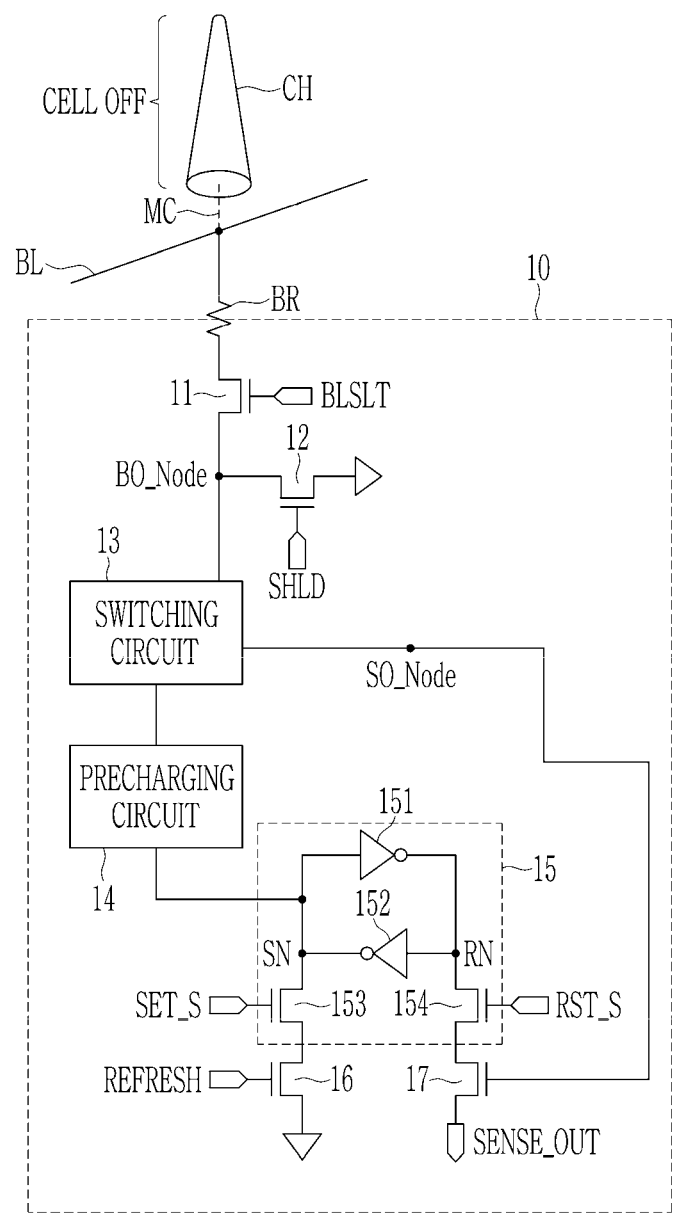
FIG. 11 is a circuit diagram illustrating a bonding quality test circuit according to some embodiments.

FIG. 11 is a circuit diagram illustrating a bonding quality test circuit according to some embodiments.

In order to prevent the above-described bonding quality test error, according to some embodiments, in a bonding quality test after formation of the channel structure CH, a plurality of memory cells constituting the channel structure CH may be controlled to be in an off state. In order to control the memory cells to be in an off state, no voltage may be applied while the gate of each memory cell is in a floating state.

The operation of the bonding quality test circuit 10 under the condition in which the channel structure CH is formed is the same as the operation of the bonding quality test circuit 10 in the precharging period, the discharging period, and the charge sharing period described above with reference to FIGS. 2 to 4. In addition, the equivalent circuit in each of the normal state and the abnormal state of the bonding quality is the same as the equivalent circuit described with reference to FIGS. 5 to 10.

The bonding quality test may be performed when a specific condition is satisfied even while the memory device is being driven. The bonding quality test circuit described in the above embodiments may be implemented through a page buffer of a memory device. Hereinafter, a memory system according to some embodiments will be described.

Figure 12:
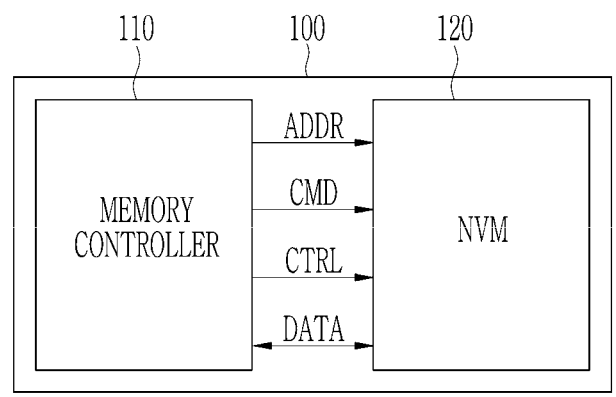
FIG. 12 is a diagram illustrating a memory storage device according to some embodiments.

FIG. 12 is a diagram illustrating a memory storage device according to some embodiments.

The memory storage device 100 may include a memory controller 110 and a memory device 120. The memory storage device 100 may include an embedded Universal Flash Storage (UFS) memory device, an embedded Multi-Media Card (eMMC), or a Solid State Drive (SSD). Also, for example, the memory storage device 100 may include a detachable UFS memory card, Compact Flash (CF), Secure Digital (SD), Micro Secure Digital (Micro-SD), Mini Secure Digital (Mini-SD), extreme Digital (xD), or memory stick. When the memory storage device 100 is an SSD, the memory storage device 100 may be a device conforming to the non-volatile memory express (NVMe) standard.

The memory device 120 may include a NAND flash memory. However, the present disclosure is not limited thereto, and the memory device 120 may include NOR flash memory, or resistive memory, such as Phase-Change RAM (PRAM), Magneto Resistive RAM (MRAM), Ferroelectric RAM (FeRAM), and Resistive RAM (RRAM). The memory device 120 according to some embodiments may include a plurality of blocks including a plurality of pages.

The memory controller 110 may be connected to the memory device 120 and may control the memory device 120 to write data DATA into the memory device 120 or to read data DATA from the memory device 120. For example, the memory controller 110 may generate an address ADDR, a command CMD, and a control signal CTRL for the memory device 120 according to a logic block address and a request signal received from the outside (for example, an external host) and may provide the generated address ADDR, command CMD, and control signal CTRL to the memory device 120. The memory controller 110 may provide signals to the memory device 120 to write data DATA in the memory device 120 or read data DATA from the memory device 120.

Figure 13:
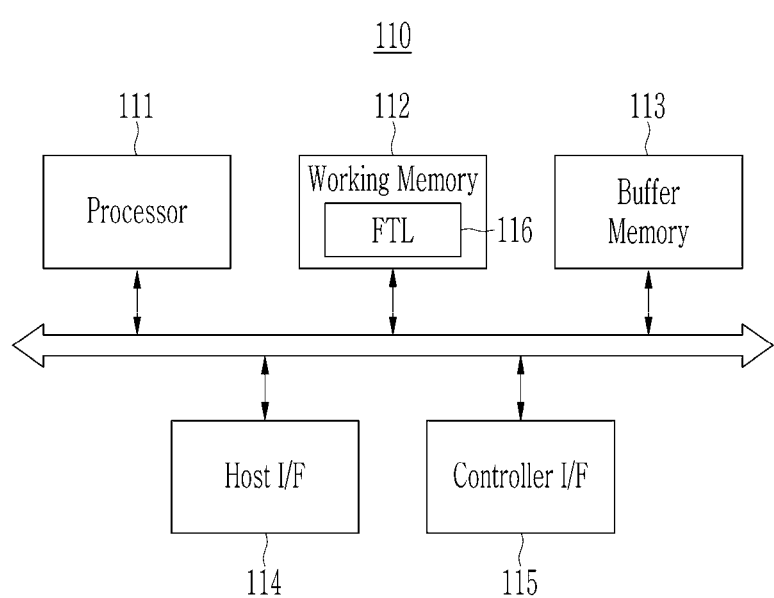
FIG. 13 is a block diagram illustrating a memory controller of FIG. 12.

FIG. 13 is a block diagram for describing the memory controller of FIG. 12.

As illustrated in FIG. 13, the memory controller 110 may include a processor 111, a working memory 112, a buffer memory 113, a host interface 114, a controller interface 115, and the like.

The processor 111 may include a Central Processing Unit (CPU), a controller, or an Application Specific Integrated Circuit (ASIC). The processor 111 may control overall operations of the memory controller 110. The processor 111 may control the memory controller 110 by driving firmware loaded in the working memory 112.

The host interface 114 may transmit/receive packets with an external host (not illustrated). A packet transmitted from the host to the host interface 114 may include a command or data to be written to the memory device 120, and the packet transmitted from the host interface 114 to the host may include a response to a command or data read from the memory device 120.

The controller interface 115 may provide signal transmission/reception with the memory device 120. The controller interface 115 may transmit command and control signals together with data to be written in the memory device 120 to the memory device 120 or may receive data read from the memory device 120. The controller interface 115 may be implemented to comply with standard protocols, such as Toggle or ONFI.

The working memory 112 may include a flash translation layer (FTL) 116. The flash translation layer 116 may include system software that manages data writing, data reading, and block erase operations of the memory device 120. For example, the flash translation layer 116 may include firmware. Flash translation layer 116 may be loaded into the working memory 112. Firmware of the flash translation layer 116 may be executed by the processor 111. The flash translation layer 116 may perform various functions, such as address mapping, wear-leveling, and garbage collection. The flash translation layer 116 may perform an address mapping operation that changes a logical block address received from the host into a physical address used to actually store data in the memory device 120. The flash translation layer 116 may perform wear leveling on a plurality of physical blocks so that the physical blocks in the memory device 120 are uniformly used. The flash translation layer 116 may perform garbage collection to secure usable capacity in the memory device 120 by copying valid data of a block to a new block and then erasing the old block.

The buffer memory 113 may store code data required for initial booting of the memory storage device 100. The buffer memory 113 may buffer a logical block address, request signal, data, and the like received from the host. Signals buffered in the buffer memory 113 may be transferred to the memory device 120 through the controller interface 115. For example, data DATA buffered in the buffer memory 113 may be programmed into the memory device 120.

Figure 14:
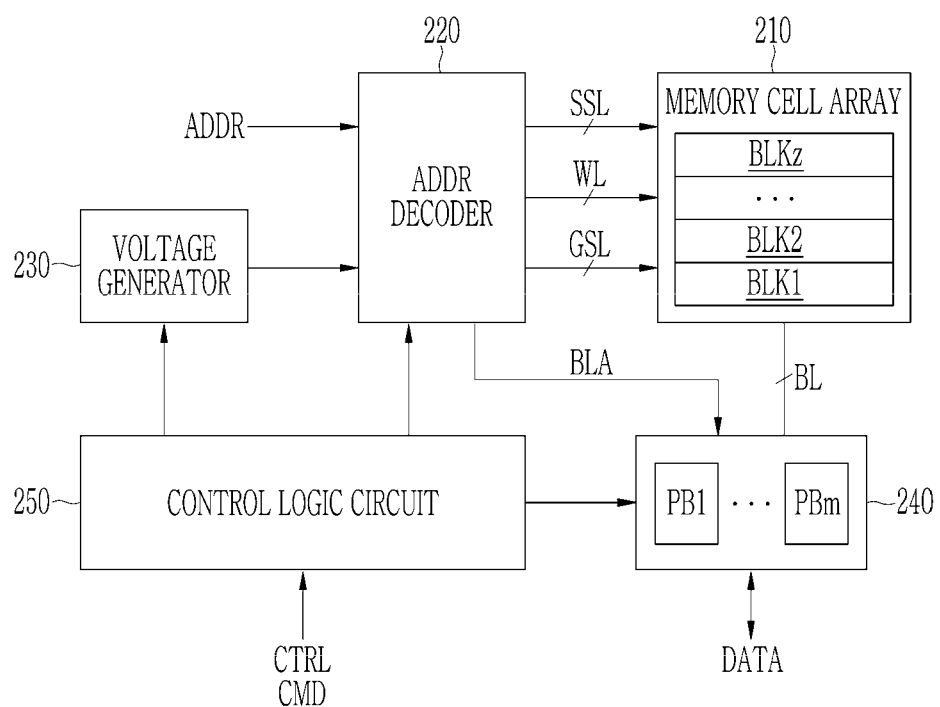
FIG. 14 is a block diagram illustrating a memory device according to some embodiments.

FIG. 14 is a block diagram illustrating a memory device according to some embodiments.

Referring to FIG. 14, the memory device 120 may include a memory cell array 210, an address decoder 220, a voltage generator 230, a read/write circuit 240, a control logic circuit 250, and the like.

The memory cell array 210 may include a plurality of memory blocks BLK1 to BLKz (z is a positive integer). The memory cell array 210 may be connected to the read/write circuit 240 through bit lines BL, and may be connected to the address decoder 220 through word lines WL, string select lines SSL, and ground select lines GSL. The memory cell array 210 may be connected to the address decoder 220 through word lines WL. Each of the plurality of memory blocks BLK1 to BLKz includes a plurality of memory cells. Memory cells positioned in one direction in each block may be connected to the same word line WL, and a plurality of memory cells positioned along another direction orthogonal to the one direction may be connected to one bit line BL.

The address decoder 220 may operate in response to the control of the control logic circuit 250. The address decoder 220 may receive the address ADDR from the memory controller 110. The address decoder 220 may decode a word line address indicating a word line among the received addresses ADDR. The address decoder 220 may select the word line WL according to the word line address. The address decoder 220 may decode a bit line address BLA indicating a bit line among the received addresses ADDR, and may provide the bit line address BLA to the read/write circuit 240. The address decoder 220 may receive a voltage required for operations, such as program and read, from the voltage generator 230.

The voltage generator 230 may generate a voltage required for an access operation under the control of the control logic circuit 250. For example, the voltage generator 230 may generate a program voltage and a program verification voltage required to perform a program operation. For example, the voltage generator 230 may generate read voltages necessary for performing a read operation, and may generate an erase voltage and an erase verification voltage necessary for performing an erase operation. Also, the voltage generator 230 may provide the address decoder 220 with a voltage necessary for performing each operation.

The read/write circuit 240 may be connected to the memory cell array 210 through the bit line BL. The read/write circuit 240 may exchange data DATA with the memory controller 110. The read/write circuit 240 may operate in response to the control of the control logic circuit 250. The read/write circuit 240 may receive the decoded bit line address BLA from the address decoder 220. The read/write circuit 240 may select the bit line BL according to the decoded bit line address BLA. The read/write circuit 240 may program the received data DATA into the memory cell array 210. The read/write circuit 240 may read data from the memory cell array 210 and may provide the read data to the outside (for example, to the memory controller 110). For example, the read/write circuit 240 may include a plurality of page buffers PB1 to PBm (m is an integer greater than or equal to 3). Each of the plurality of page buffers PB1 to PBm may be respectively connected to the memory cells through a plurality of bit lines BL. Each of the plurality of page buffers PB1 to PBm may apply a bit line voltage corresponding to data to be programmed to a selected bit line during a program operation. Each of the plurality of page buffers PB1 to PBm may sense the data stored in a memory cell by sensing a current or voltage of the selected bit line during a read operation.

The control logic circuit 250 may control the operation of the memory device 120 by transferring each of a plurality of signals required for control operations of the address decoder 220, the voltage generator 230, and the read/write circuit 240 at a corresponding time. The control logic circuit 250 may operate in response to a control signal CTRL and a command CMD (for example, an erase command, a write command, and a read command) provided from the memory controller 110. The control logic circuit 250 may perform an erase operation on a sub-block indicated by the address ADDR based on the erase command CMD provided from the memory controller 110 and the address ADDR in units of sub-blocks for the plurality of blocks constituting the memory cell array 210. For example, the control logic circuit 250 may control the voltage generator 230 and the address decoder 220 to supply an erase voltage to word lines of a sub-block corresponding to the address ADDR.

Figure 15:
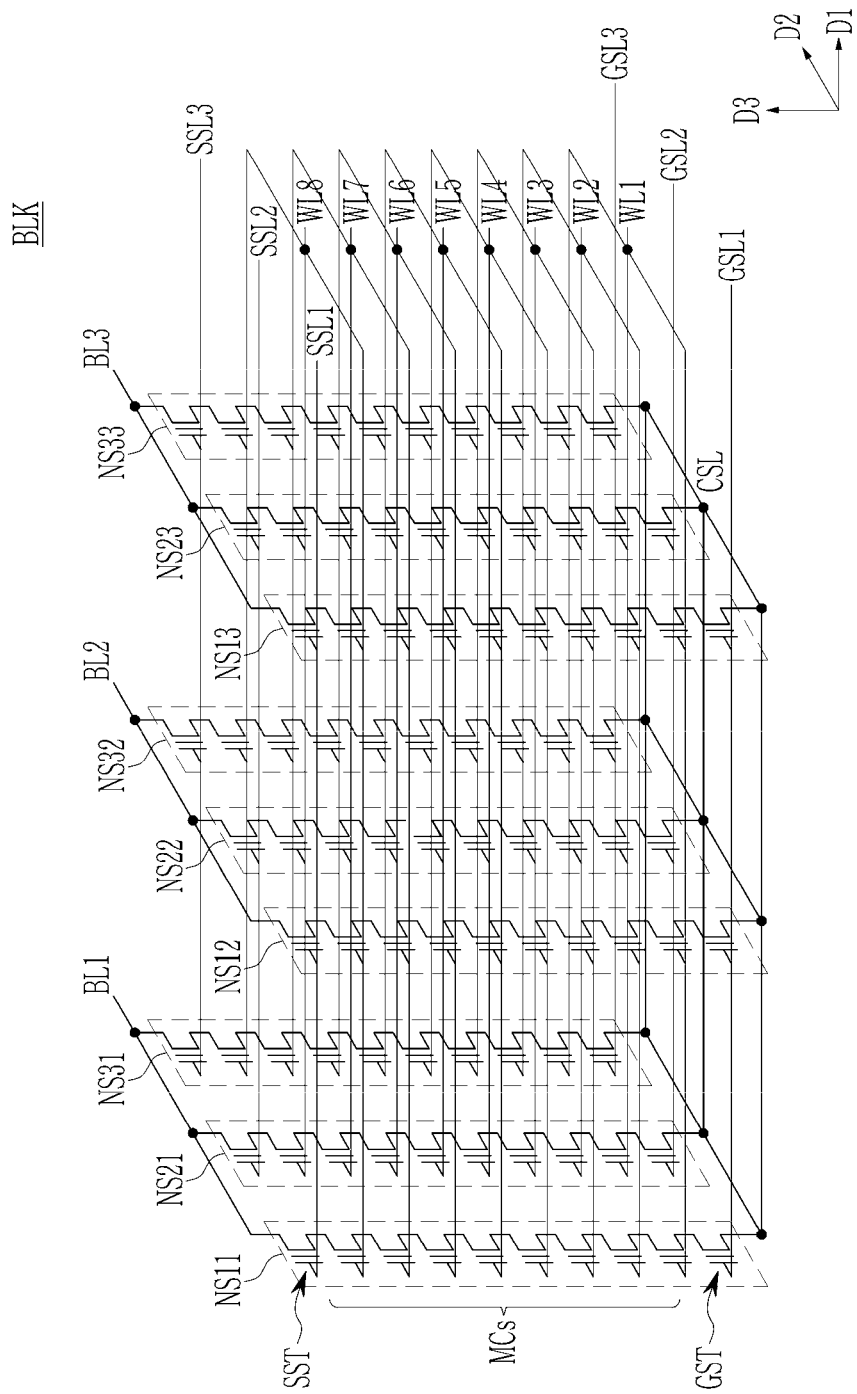
FIG. 15 is a circuit diagram illustrating a memory cell array according to some embodiments.

FIG. 15 is a circuit diagram illustrating a memory cell array according to some embodiments.

As illustrated in FIG. 15, a circuit diagram of one block BLK among a plurality of blocks included in the memory device 120 is illustrated. The circuit diagram illustrated in FIG. 15 is an example for explaining some embodiments, and the present disclosure is not limited thereto. For example, although three bit lines BL1 to BL3 are illustrated in FIG. 15, the number of bit lines connected to the block BLK may be four or more.

As illustrated in FIG. 15, the memory block BLK includes NAND strings NS11 to NS33, and each NAND string (for example, NS11) may include a string select transistor SST, a plurality of memory cells MCs, and a ground select transistor GST connected in series. The transistors SST and GST and the memory cells MCs included in each NAND string may form a stacked structure along the third direction D3 (that is, the vertical direction) on the substrate.

The word lines WL1 to WL8 may extend along the first direction D1, and the bit lines BL1 to BL3 may extend along the second direction D2. NAND strings NS11, NS21, and NS31 may be positioned between the first bit line BL1 and the common source line CSL, NAND strings NS12, NS22, and NS32 may be positioned between the second bit line BL2 and the common source line CSL, and NAND strings NS13, NS23, and NS33 may be positioned between the third bit line BL3 and the common source line CSL. The string select transistor SST may be connected to a corresponding one of the string select lines SSL1 to SSL3. The memory cells MCs may be connected to corresponding word lines WL1 to WL8, respectively. The ground select transistor GST may be connected to a corresponding one of the ground select lines GSL1 to GSL3. The string select transistor SST may be connected to a corresponding one of the bit lines BL1 to BL3, and the ground select transistor GST may be connected to the common source line CSL. Here, the number of NAND strings, the number of word lines, the number of bit lines, the number of ground selection lines, and the number of string selection lines may be variously changed according to embodiments.

Figure 16:
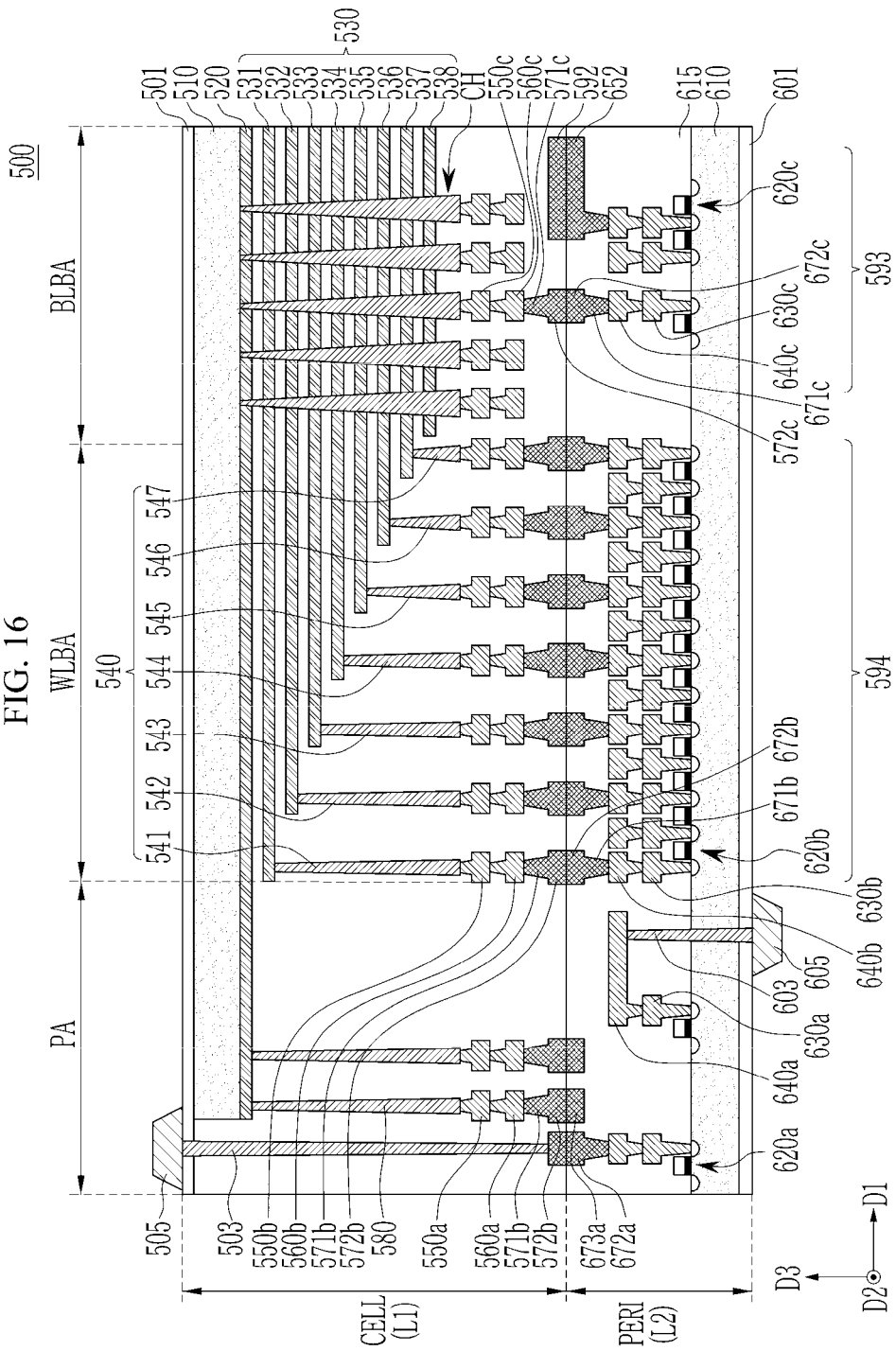
FIG. 16 is an exemplary cross-sectional view of a memory device having a BV structure according to some embodiments.

FIG. 16 is an exemplary cross-sectional view of the memory device having a BV structure according to some embodiments.

FIG. 16 is a cross-sectional view of the memory device 500 having a BV structure or a chip to chip (C2C) structure. The cross-sectional view of the memory device 500 illustrated in FIG. 16 is an example for explaining some embodiments, and the present disclosure is not limited thereto. The memory device 500 of FIG. 16 may correspond to the memory device 120 of FIGS. 12 and 14. As illustrated in FIG. 16, the present disclosure may be applied to a structure in which the memory device 500 has a structure in which a first semiconductor layer L1 that is a cell area CELL in which memory cells are formed and a second semiconductor layer L2 that is a peripheral circuit area PERI where a peripheral circuit is formed are connected through a bonding metal. Each of the first semiconductor layer L1 and the second semiconductor layer L2 of the memory device 500 may include an external pad bonding area PA, a word line bonding area WLBA, and a bit line bonding area BLBA. The memory cell array 210 of FIG. 14 may be disposed in the cell area CELL, and elements 220 to 250 other than the memory cell array 210 of FIG. 14 may be disposed in the peripheral circuit area PERI.

The peripheral circuit area PERI may include a first substrate 610, an interlayer insulating layer 615, a plurality of circuit elements 620a, 620b, and 620c formed on the first substrate 610, first metal layers 630a, 630b, 630c connected to the plurality of circuit elements 620a, 620b, and 620c, respectively, and second metal layers 640a, 640b, and 640c formed on the first metal layers 630a, 630b, and 630c, respectively. In some embodiments, the first metal layers 630a, 630b, and 630c may be formed of tungsten having relatively high resistance, and the second metal layers 640a, 640b, and 640c may be formed of copper having relatively low resistance.

In FIG. 16, only the first metal layers 630a, 630b, and 630c and the second metal layers 640a, 640b, and 640c are illustrated, but the present disclosure is not limited thereto, and at least one metal layer may also be further formed on the second metal layers 640a, 640b, and 640c. At least some of the one or more metal layers formed on the second metal layers 640a, 640b, and 640c may be formed of aluminum and the like having a lower resistance than that of copper forming the second metal layers 640a, 640b, and 640c.

The interlayer insulating layer 615 is disposed on the first substrate 610 to cover the plurality of circuit elements 620a, 620b, and 620c, the first metal layers 630a, 630b, and 630c, and the second metal layers 640a, 640b, and 640c, and may include an insulating material, such as silicon oxide or silicon nitride.

Lower bonding metals 671b and 672b may be formed on the second metal layer 640b of the word line bonding area WLBA. In the word line bonding area WLBA, the lower bonding metals 671b and 672b of the peripheral circuit area PERI may be electrically connected to the upper bonding metals 571b and 572b of the cell area CELL by a bonding method, and the lower bonding metals 671b and 672b and the upper bonding metals 571b and 572b may be formed of aluminum, copper, or tungsten.

The cell area CELL may provide at least one memory block. The cell area CELL may include the second substrate 510 and the common source line 520. A plurality of word lines 531 to 538 (530) may be stacked on the second substrate 510 along a direction perpendicular to the top surface of the second substrate 510 (that is, the third direction D3). String select lines and a ground select line may be disposed on upper and lower portions of the word lines 530, and a plurality of word lines 530 may be disposed between the string select lines and the ground select line.

In the bit line bonding area BLBA, the channel structure CH may extend in a direction perpendicular to the top surface of the second substrate 510 (e.g., the third direction D3) and may pass or extend through the word lines 530, the string select lines, and the ground select line. The channel structure CH may include a data storage layer, a channel layer, a buried insulating layer, and the like, and the channel layer may be electrically connected to the first metal layer 550c and the second metal layer 560c. For example, the first metal layer 550c may be a bit line contact, and the second metal layer 560c may be a bit line. In some embodiments, the bit line 560c may extend along the second direction D2 parallel to the top surface of the second substrate 510.

In some embodiments, a region where the channel structure CH and the bit line 560c are disposed may be defined as a bit line bonding area BLBA. The bit line 560c may be electrically connected to the circuit elements 620c providing the page buffer 593 of the peripheral circuit area PERI in the bit line bonding area BLBA. For example, the bit line 560c may be connected to the upper bonding metals 571c and 572c of the cell area CELL, and the upper bonding metals 571c and 572c may be connected to the lower bonding metals 671c and 672c connected to the circuit elements 620c of the page buffer 593. Accordingly, the page buffer 593 may be connected to the bit line 560c through the bonding metals 571c, 572c, 671c, and 672c. In some embodiments, the page buffer 593 may correspond to the bonding quality test circuit 10. Although not illustrated in FIG. 16, a control circuit for controlling the operation of the page buffer 593 may be further disposed in the bit line bonding area BLBA. The page buffer control circuit may control each of the page buffers based on different control timings.

In the word line bonding area WLBA, the word lines 530 may extend along the first direction D1 parallel to the top surface of the second substrate 510, and may be connected with the plurality of cell contact plugs 541 to 547 (540). The word lines 530 and the cell contact plugs 540 may be connected to each other through pads provided by extending at least some of the word lines 530 with different lengths along the first direction D1. A first metal layer 550b and a second metal layer 560b may be sequentially connected to upper portions of the cell contact plugs 540 connected to the word lines 530. The cell contact plugs 540 may be connected to the peripheral circuit area PERI through the upper bonding metals 571b and 572b of the cell area CELL and the lower bonding metals 671b and 672b of the peripheral circuit area PERI in the word line bonding area WLBA.

The cell contact plugs 540 may be electrically connected to circuit elements 620b providing a row decoder 594 that drives a row address in the peripheral circuit area PERI. The row decoder 594 may be part of the address decoder 220 illustrated in FIG. 14. In some embodiments, the operating voltages of the circuit elements 620b providing the row decoder 594 may be different from the operating voltages of the circuit elements 620c providing the page buffer 593. For example, the operating voltages of circuit elements 620c providing the page buffer 593 may be higher than the operating voltages of circuit elements 620b providing the row decoder 594.

A common source line contact plug 580 may be disposed in the external pad bonding area PA. The common source line contact plug 580 is formed of a conductive material, such as metal, metal compound, or polysilicon, and may be electrically connected to the common source line 520. A first metal layer 550a and a second metal layer 560a may be sequentially stacked on the common source line contact plug 580. For example, a region where the common source line contact plug 580, the first metal layer 550a, and the second metal layer 560a are disposed may be defined as an external pad bonding area PA.

Meanwhile, input/output pads 505 and 605 may be disposed in the external pad bonding area PA. A lower insulating layer 601 covering a lower surface of the first substrate 610 may be formed under the first substrate 610, and a first input/output pad 605 may be formed on the lower insulating layer 601. The first input/output pad 605 is connected to at least one of the plurality of circuit elements 620a, 620b, and 620c disposed in the peripheral circuit area PERI through the first input/output contact plug 603, and may be separated from the first substrate 610 by the lower insulating layer 601. In addition, a side insulating layer may be disposed between the first input/output contact plug 603 and the first substrate 610 to electrically separate or insulate the first input/output contact plug 603 from the first substrate 610.

An upper insulating layer 501 covering a surface of the second substrate 510 may be formed on the second substrate 510, and a second input/output pad 505 may be disposed on the upper insulating layer 501. The second input/output pad 505 may be connected to at least one of the plurality of circuit elements 620a, 620b, and 620c disposed in the peripheral circuit area PERI through the second input/output contact plug 503.

In some embodiments, the second substrate 510, the common source line 520, and the like may not be disposed in the region in which the second input/output contact plug 503 is disposed. Further, the second input/output pad 505 may not overlap the word lines 530 in the third direction D3. The second input/output contact plug 503 may be separated from the second substrate 510 in a direction parallel to the top surface of the second substrate 510 (e.g., the first direction D1) and may pass or extend through the interlayer insulating layer (not labeled) of the cell area CELL to be connected to the second input/output pad 505.

In some embodiments, the first input/output pad 605 and the second input/output pad 505 may be selectively formed. For example, the memory device 500 may include only the first input/output pad 605 disposed on the first substrate 610 or may include only the second input/output pad 505 disposed on the second substrate 510. In some embodiments, the memory device 500 may also include both the first input/output pad 605 and the second input/output pad 505.

The metal pattern of the uppermost metal layer exists in a dummy pattern in each of the external pad bonding area PA and the bit line bonding area BLBA included in the cell area CELL and the peripheral circuit area PERI, respectively, and the uppermost metal layer may be empty.

In the memory device 500, a lower metal pattern 673a having the same shape as that of the upper bonding metal 572b may be formed in the uppermost metal layer of the peripheral circuit area PERI in correspondence to the upper bonding metal 572b formed in the uppermost metal layer of the cell area CELL in the external pad bonding area PA. The lower metal pattern 673a formed on the uppermost metal layer of the peripheral circuit area PERI may not be connected to a separate contact in the peripheral circuit area PERI. Similarly, an upper metal pattern having the same shape as that of the lower metal pattern of the peripheral circuit area PERI may also be formed in the upper metal layer of the cell area CELL in correspondence to the lower metal pattern formed in the uppermost metal layer of the peripheral circuit area PERI in the external pad bonding area PA.

Upper bonding metals 671b and 672b may be formed on the second metal layer 640b of the word line bonding area WLBA. In the word line bonding area WLBA, the upper bonding metals 671b and 672b of the peripheral circuit area PERI may be electrically connected to the upper bonding metals 571b and 572b of the cell area CELL by a bonding method.

Further, in the bit line bonding area BLBA, an upper metal pattern 592 having the same shape as that of a lower metal pattern 652 may be formed in the uppermost metal layer of the cell area CELL in correspondence to the lower metal pattern 652 formed in the uppermost metal layer of the peripheral circuit area PERI in the bit line bonding area BLBA. A contact may not be formed on the upper metal pattern 592 formed on the uppermost metal layer of the cell area CELL.

Figure 17:
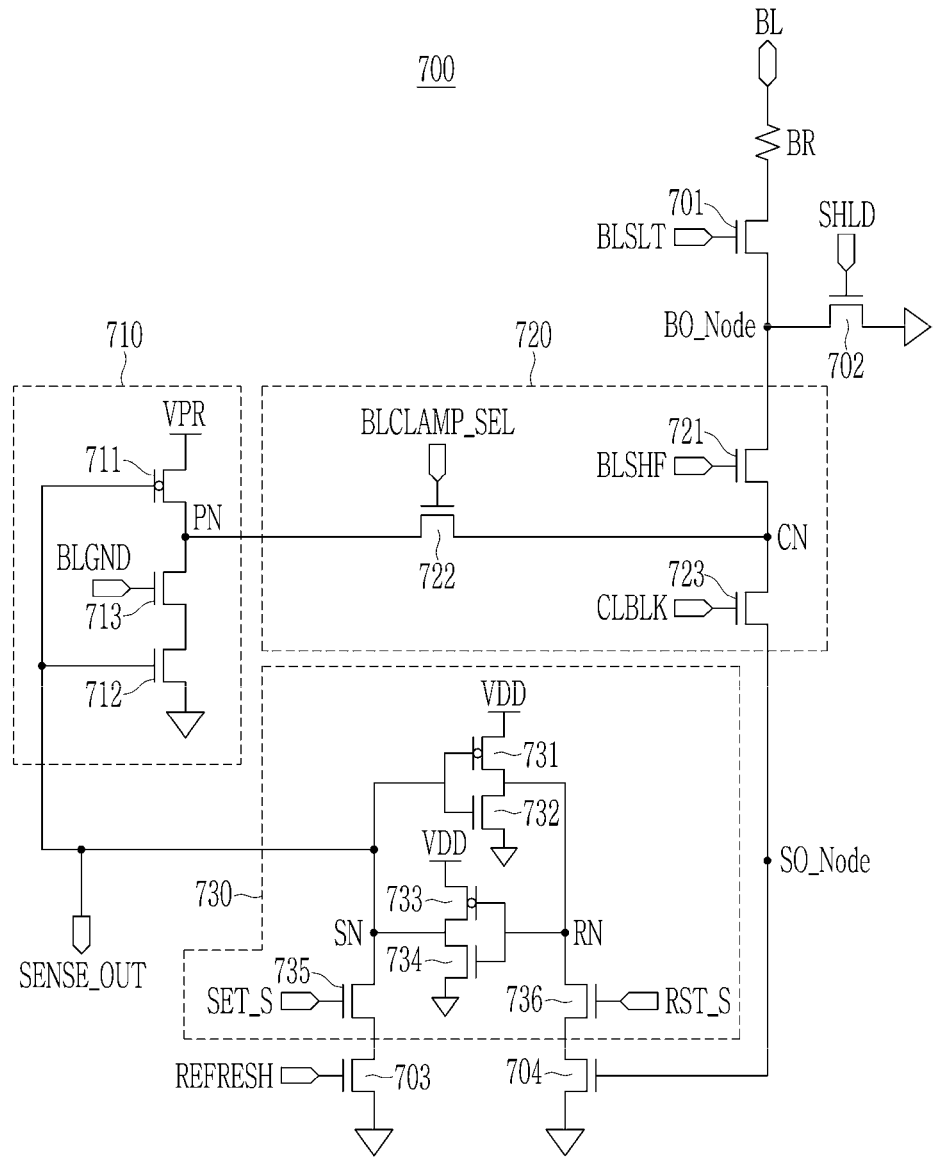
FIG. 17 is a diagram illustrating some configurations of a page buffer circuit according to some embodiments.

FIG. 17 is a diagram illustrating some configurations of the page buffer circuit according to some embodiments.

The page buffer circuit 700 and the bit line BL are connected through bonding metals (for example, 571c, 572c, 671c, and 672c in FIG. 16), and are illustrated as an equivalent bonding resistor BR in FIG. 17.

The page buffer circuit 700 may include a precharging circuit 710, a switching circuit 720, and a latch circuit 730. The precharging circuit 710, the switching circuit 720, and the latch circuit 730 may be the configurations corresponding to the precharging circuit 14, the switching circuit 13, and the latch circuit 15 illustrated in FIG. 1. The transistor 701, the transistor 702, the transistor 703, and the transistor 704 are the configurations corresponding to the transistor 11, the transistor 12, the transistor 16, and the transistor 17 illustrated in FIG. 1 and detailed description thereof will be omitted.

The precharging circuit 710 includes two transistors 711 and 712 that perform a switching operation according to the voltage of the node SN, which is an output of the latch circuit 730, and a transistor 713 that performs a switching operation according to a bit line ground signal BLGND. A precharge voltage VPR is supplied to one end of the transistor 711, the other end of the transistor 711 is connected to the node PN, one end of the transistor 713 is connected to the node PN, the other end of the transistor 713 is connected to one end of the transistor 712, and the other end of the transistor 712 is connected to ground. The gates of the transistors 711 and 712 are connected to the node SN, and the bit line ground signal BLGND may be supplied to the gate of the transistor 713. When the voltage of the node SN is at a low level, the precharging circuit 710 may provide the precharging voltage VPR through the node PN through the on-state transistor 711. For example, the transistor 711 may be in an on state when a signal supplied to the gate of the transistor 711 is at a low level (e.g., when the voltage at the node SN is at a low level).

The switching circuit 720 may include three transistors 721 to 723. The transistor 721 is connected between the bonding node BO_Node and the node CN, the transistor 722 is connected between the node PN and the node CN, and the transistor 723 is connected between the node CN and the sensing node SO_Node. A bit line shutoff signal BLSHF may be supplied to the gate of the transistor 721, a bit line clamping control signal BLCLAMP_SEL may be supplied to the gate of the transistor 722, and a bit line connection control signal CLBLK may be supplied to the gate of the transistor 723.

The latch circuit 730 may include six transistors 731 to 736. The two transistors 731 and 732 may be implemented as CMOS transistors and may constitute an inverter. The two transistors 733 and 734 may also be implemented as CMOS transistors, and may constitute an inverter. The gates of the two transistors 731 and 732 are connected to the node SN, the drains of the two transistors 731 and 732 are connected to the node RN, the source of the transistor 731 is supplied with a voltage VDD, and the source of the transistor 732 is grounded. The gates of the two transistors 733 and 734 are connected to the node RN, the drains of the two transistors 733 and 734 are connected to the node SN, the source of the transistor 733 is supplied with the voltage VDD, and the source of the transistor 734 is grounded.

One end of the transistor 735 is connected to the node SN, the set signal SET_S is supplied to the gate of the transistor 735, and the other end of the transistor 735 is connected to one end of the transistor 703. One end of the transistor 736 is connected to the node RN, a reset signal RST_S is supplied to the gate of the transistor 736, and the other end of the transistor 736 is connected to one end of the transistor 704. The gate of the transistor 704 is connected to the sensing node SO_Node, and the other end of the transistor 704 is connected to the ground. When the transistor 704 is turned on by the voltage of the sensing node SO_Node and the transistor 736 is turned on by the reset signal RST_S, the node RN is connected to the ground, so that the transistor 733 may be turned on. For example, the transistor 733 may be in an on state when a signal supplied to the gate of the transistor 733 is at a low level (e.g., when the voltage of the node RN is at a low level). Then, the voltage VDD is supplied to the node SN, so that the output signal SENSE_OUT is provided at the voltage VDD level. In contrast, when the transistor 704 is in an off state by the voltage of the sensing node SO_Node, the output signal SENSE_OUT may be at the ground level. The output signal SENSE_OUT may be input to the control logic circuit 250 (e.g., see FIG. 14), and the control logic circuit 250 may determine the state of the bonding quality according to the level of the output signal SENSE_OUT.

Figure 18:
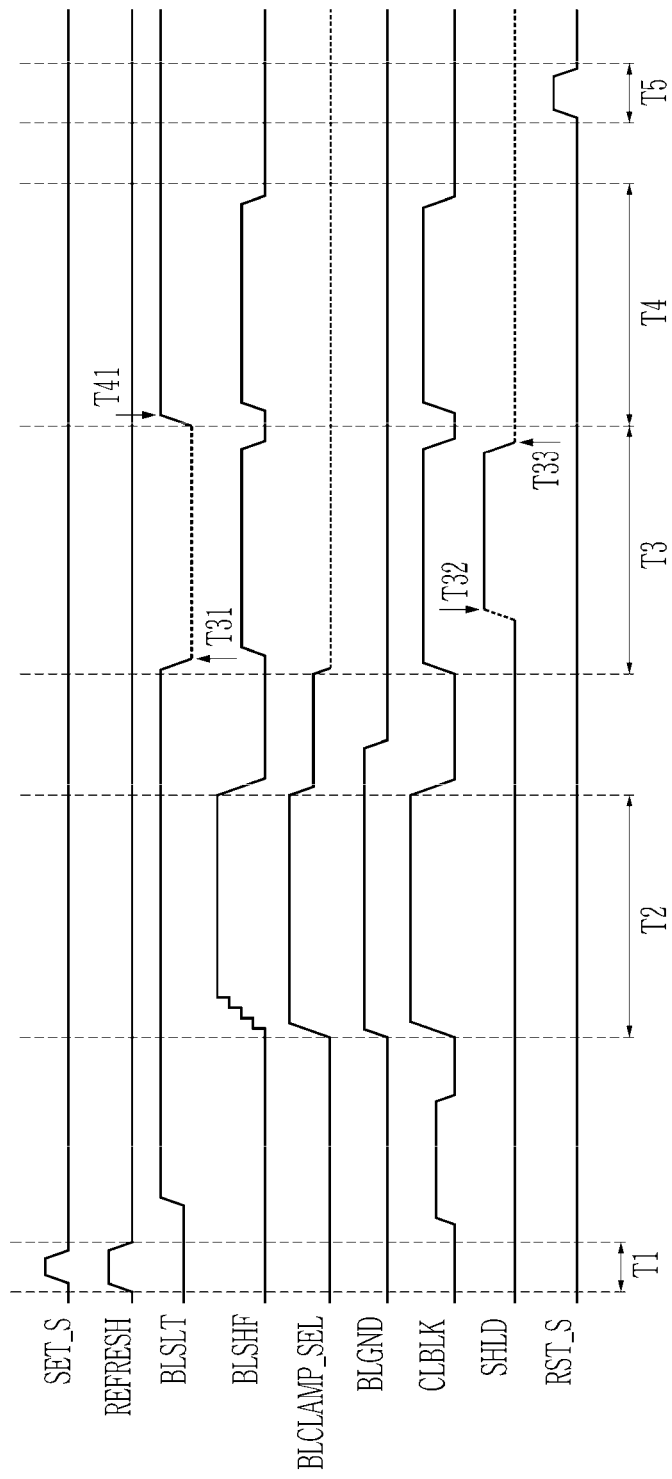
FIG. 18 is a waveform diagram of signals controlling an operation of the page buffer circuit according to some embodiments.

FIG. 18 is a waveform diagram of signals controlling an operation of the page buffer circuit according to some embodiments.

Referring to FIGS. 17 and 18, during the period T1, a set signal SET_S and a refresh signal REFRESH may become high levels, which are on levels. Then, the transistor 735 and the transistor 703 are turned on to supply the ground voltage to the node SN, and the voltage of the node SN may be latched to the ground level by the inverter formed of the two transistors 731 and 732 and the inverter formed of the two transistors 733 and 734.

During the period T2, the bit line clamping control signal BLCLAMP_SEL, the bit line connection control signal CLBLK, the bit line shutoff signal BLSHF, and the bit line selection signal BLSLT may become high levels, which are on levels. Then, the transistor 722, the transistor 723, the transistor 721, and the transistor 701 may be turned on, so that the precharge voltage VPR may be supplied to the bit line BL and the sensing node SO_Node. As such, the period T2 may include a precharging period.

During the period T3, the bit line clamping control signal BLCLAMP_SEL and the bit line selection signal BLSLT become low level, which is an off level, and the bit line connection control signal CLBLK, the bit line shutoff signal BLSHF, and the shielding signal SHLD may have a high level. Then, the transistor 722 is turned off to cut off the supply of the precharge voltage VPR, and the transistor 701 is turned off to cut off the bit line BL from the bonding node BO_Node. When the transistors 702, 721, and 723 are turned on, the sensing node SO_Node may be connected to the ground (e.g., through the transistors 702, 721, and 723), and the sensing node SO_Node may be discharged. As such, the period T3 may include a discharging period. A time point T31 when the transistor 701 is turned off may precede a time point T32 when the transistor 702 is turned on.

During the period T4, the bit line clamping control signal BLCLAMP_SEL is maintained at a low level and the shielding signal SHLD becomes a low level, and the bit line selection signal BLSLT, the bit line connection control signal CLBLK, and the bit line shutoff signal BLSHF may have a high level. Then, since the transistor 722 is in an off state, the precharge voltage VPR is cut off, and the transistor 702 is turned off, so that the sensing node SO_Node may be cut off from the ground. The transistors 701, 721, and 723 are turned on, so that charges accumulated in the bit line BL during the precharging period may be shared with the sensing node SO_Node. As such, the period T4 may include a charge sharing period. A time point T33 when the transistor 702 is turned off may precede a time point T41 when the transistor 701 is turned on.

In the period T5, when the reset signal RST_S becomes a high level, which is an on level, the transistor 736 is turned on. Since the voltage of the node SN is at a low level, the transistor 731 is turned on and the voltage of the node RN may follow the voltage VDD. For example, the transistor 731 may be in an on state when a signal supplied to the gate of the transistor 731 is at a low level (e.g., when the voltage of the node SN is at a low level). When the bonding quality is normal, and the bit line BL is charged by the precharge voltage VPR during the precharging period and the charge of the bit line BL is shared with the sensing node SO_Node during the charge sharing period, the gate voltage of the transistor 704 is high enough to be an on-state, so that the voltage of the node RN may be ground, the transistor 733 is an on-state, and the level of the output signal SENSE_OUT may follow the voltage VDD. When the bonding quality is abnormal, and the bit line BL is not charged by the precharge voltage VPR during the precharging period and the charge of the bit line BL is not shared with the sensing node SO_Node during the charge sharing period, the gate voltage of the transistor 704 is low and the transistor 704 is in an off state, so that the voltage of the node RN may be the voltage VDD, the transistor 734 is an on-state, and the output signal SENSE_OUT may follow the ground voltage.

The latch circuit 730 of the page buffer circuit 700 illustrated in FIG. 17 may correspond to a sensing latch. When the page buffer circuit 700 does not perform a bonding quality test, the latch circuit 730 may store data stored in a memory cell or a sensing result of a threshold voltage of the memory cell during a read or program verification operation. Also, the latch circuit 730 may apply a program bit line voltage or a program inhibition voltage to the bit line BL during a program operation.

In this way, the bonding quality test may be performed not only during the process of manufacturing the memory device, but also when the memory device is in operation. The bonding quality test may be performed in consideration of the number of times of the operation cycles of each of the plurality of blocks BLK1 to BLKz (e.g., see FIG. 14). For example, the control logic circuit 250 (e.g., see FIG. 14) may set an operation limit cycle and perform a bonding quality test on a block of which the number of times of the operation cycles reaches the operation limit cycle among the plurality of blocks BLK1 to BLKz. The operation cycle is a cycle for memory operations, such as programming, reading, verifying, and erasing a block, and the number of times of the operation cycles may mean the number of times of the memory operation performed on a block. For example, the number of times of the operation cycles may be based on an erase count, which is a result of counting the number of times of the erase operations performed on a block. A bonding quality test may be performed on a block of which an erase count value reaches a threshold value corresponding to the operation limit cycle.

When the control logic circuit 250 receives an erase command as a defense code from the memory controller 110 (e.g., see FIGS. 12 and 13), the control logic circuit 250 may determine whether the number of times of the operation cycles of the block BLKi (where i is one of integers from 1 to z), which is the target of the erase command, reaches the operation limit cycle. For example, the control logic circuit 250 may receive an erase command as a defense code for the block BLKi including a plurality of memory cells. When the number of times of the operation cycles of the block BLKi reaches the operation limit cycle, the control logic circuit 250 may control the memory storage device 100 (e.g., see FIG. 12) to perform a bonding quality test before an erase operation according to the erase command CMD. The operation limit cycle may be predetermined. For example, an operation cycle of the block BLKi may include an erase operation performed on the block BLKi based on the erase command CMD, and a number of times of the operation cycle of the block BLKi may be based on a number of times of the erase operations performed on a block BLKi. In some embodiments, when the number of times of the operation cycle of the block BLKi reaches the predetermined operation limit cycle, the control logic circuit 250 may control the memory storage device 100 to perform the bonding quality test.

Figure 19:
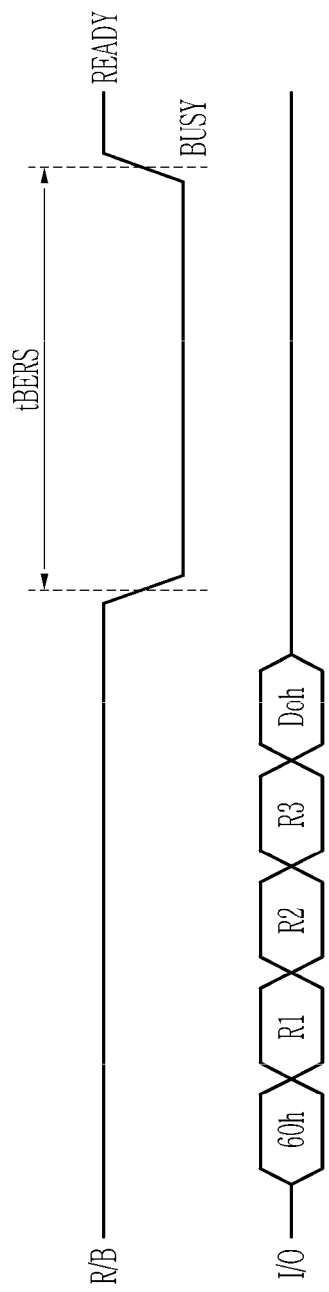
FIG. 19 is a diagram illustrating an erase command provided to the memory device according to some embodiments.

FIG. 19 is a diagram illustrating an erase command provided to the memory device according to some embodiments.

Figure 20:
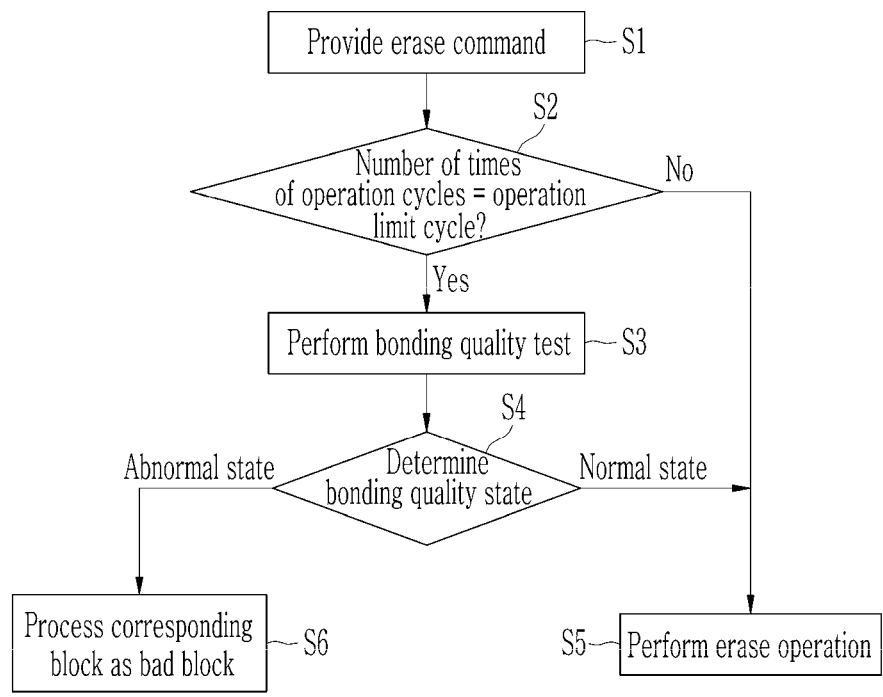
FIG. 20 is a flowchart illustrating a method of performing a bonding quality test in response to the erase command by the memory device according to some embodiments.

FIG. 20 is a flowchart illustrating a method of performing a bonding quality test in response to the erase command by the memory device according to some embodiments.

FIG. 19 schematically shows an input/output signal I/O and a ready/busy signal R/B between the memory controller 110 and the memory device 120.

Referring to FIGS. 19 and 20, the memory controller 110 may provide an erase command to the memory device 120 (S1). The erase command may be provided through a plurality of input/output pins provided in the memory controller 110 and the memory device 120, and multiple input/output signals I/O provided through the multiple input/output pins include values of an erase setup command "60h", addresses "R1", "R2", and "R3" instructing the erase target block, and a command "D0h" instructing the erase.

The control logic circuit 250 may determine whether the number of times of the operation cycles of the erase target block reaches the operation limit cycle (S2). Information on the number of times of the operation cycles of the erase target block may be provided by the memory controller 110 in response to a request from the control logic circuit 250. In some embodiments, a count circuit may be provided in the memory device 120, and the count circuit may obtain an operation cycle for each block by counting a signal that raises a flag during an erase recovery period after the erase operation is performed.

The control logic circuit 250 may perform a bonding quality test when the number of times of the operation cycles reaches the operation limit cycle as a result of the determination in operation S2 (S3). As described above, the bonding quality test method may be performed by using the page buffer circuit 700. When the control logic circuit 250 determines that the number of times of the operation cycles does not reach the operation limit cycle as the result of the determination in operation S2, the memory device 120 may perform the erase operation during the period tBERS (S5).

After the bonding quality test is performed, the control logic circuit 250 may determine a bonding quality state based on the output signal SENSE_OUT (S4).

As a result of the determination in operation S4, when the bonding quality state is normal, the memory device 120 may perform the erase operation on the corresponding block during the period tBERS (S5). The erase operation may perform a pre-program operation, a verification operation, a threshold voltage check operation for a string select transistor and a source select transistor, and the like. The pre-program operation is an operation of programming the memory cells so that the program states of the memory cells of a corresponding block have a distribution corresponding to a predetermined program state. The predetermined program state may be a program state most adjacent to an erase state among a plurality of program states. The verification operation is an erase verification operation, and may be performed on all word lines or some word lines of the corresponding block. As a result of performing the threshold voltage check operation for the string select transistor and the source select transistor, when the threshold voltage rises to such an extent that the erase operation is difficult, the corresponding block may be processed as a bad block.

As a result of the determination in operation S4, when the bonding quality state is in an abnormal state, the control logic circuit 250 may transmit the result that the bonding quality state of the corresponding block is in the abnormal state to the memory controller 110. The memory controller 110 may process the corresponding block as a bad block (S6). Blocks processed as bad blocks may not be used.

In the foregoing embodiments, a bonding quality test for bonding providing connection with the bit line BL was performed. However, the present disclosure is not limited thereto, and when the first semiconductor layer and the second semiconductor layer are connected through a bonding metal, the present disclosure may be applied to a bonding quality test for the corresponding bonding metal.

Figure 21:
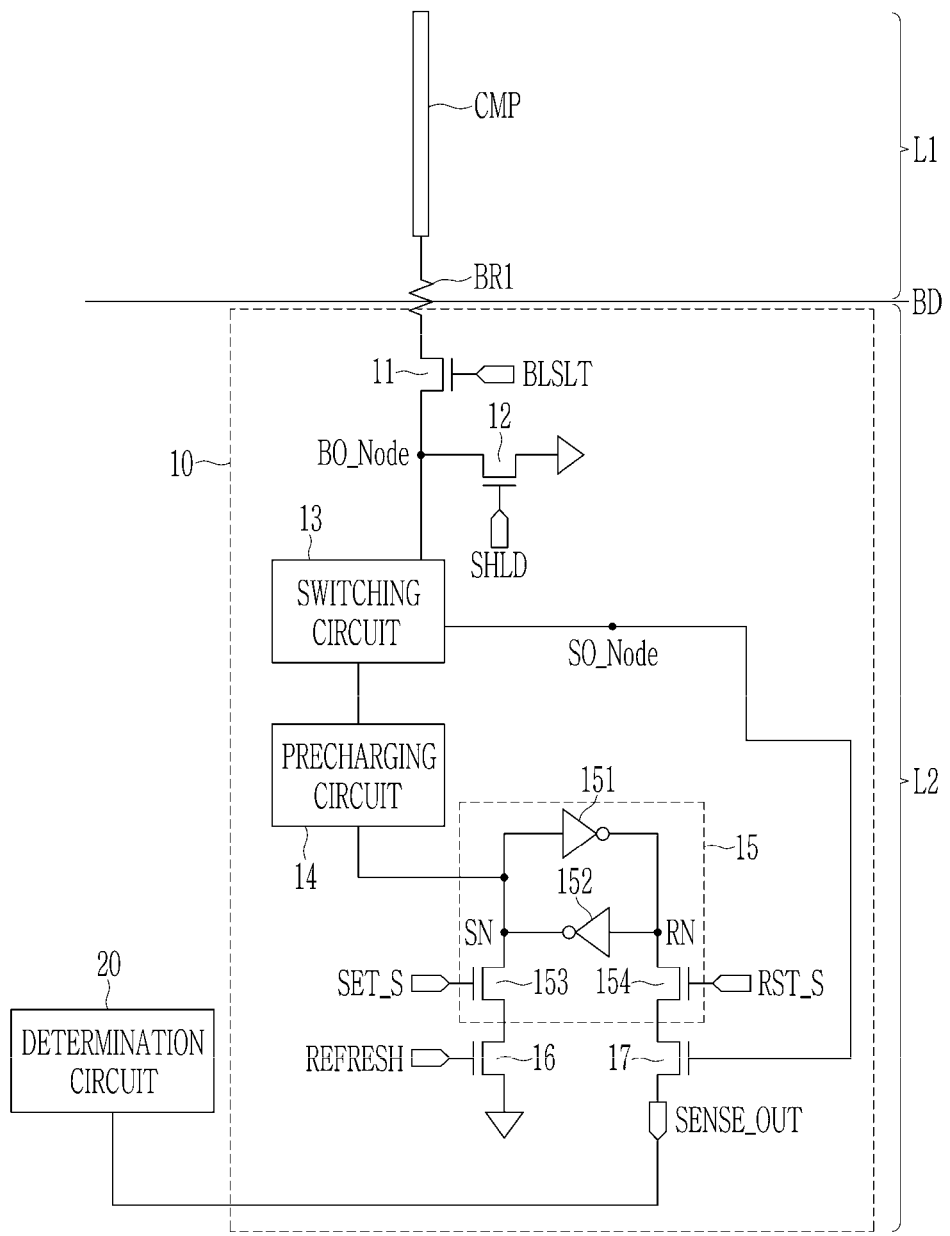
FIG. 21 is a diagram illustrating a test circuit for bonding metal connected to cell contact plugs according to some embodiments.

FIG. 21 is a diagram illustrating a test circuit for bonding metal connected to cell contact plugs according to some embodiments.

The cell contact plug CMP illustrated in FIG. 21 may be one of the plurality of cell contact plugs 540 illustrated in FIG. 16.

Compared with FIG. 1, the description of the same configuration is omitted for ease of description. The bonding resistor BR1 may equally represent the bonding metals 571$b$ and 572$b$ of the first semiconductor layer L1 and the bonding metals 671$b$ and 672$b$ of the second semiconductor layer L2 illustrated in FIG. 16.

When the bonding quality state is a normal state, the capacitance connected to the cell contact plug CMP (e.g., 540) and the capacitance of the sensing node SO_Node may be charged through the bonding resistor BR1 during the precharging period. During the discharging period, the sensing node SO_Node is discharged, and after the end of the discharging period, during the charge sharing period, the charge charged in the capacitance connected to the cell contact plug CMP (e.g., 540) is shared with the capacitance of the sensing node SO_Node, so that the voltage of the sensing node SO_Node may be provided as a high voltage. The level of the output signal SENSE_OUT provided from the transistor 17 is the voltage of the node RN and may be a high level.

When the bonding quality state is an abnormal state, the capacitance connected to the cell contact plug CMP (e.g., 540) through the bonding resistor BR1 is not charged in the precharging period. Therefore, the capacitance of the sensing node SO_Node is not charged by charge sharing after the discharging period of the sensing node SO_Node ends. Then, the voltage of the sensing node SO_Node may be provided as a low voltage. The level of the output signal SENSE_OUT provided from the transistor 17 is lower than that of the normal state.

Figure 22:
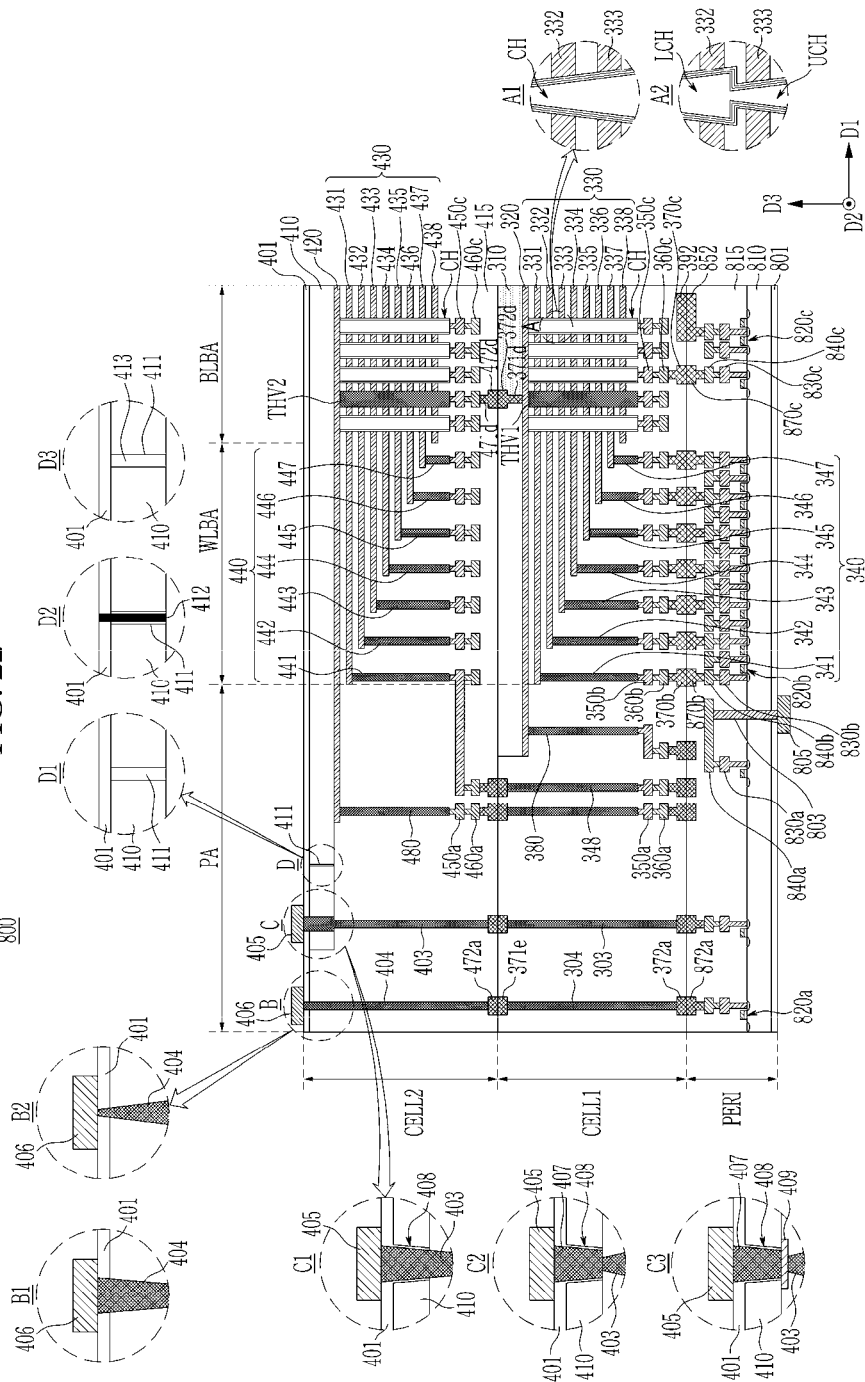
FIG. 22 is an example of a BV structure to which the bonding quality test circuit according to some embodiments may be applied.

FIG. 22 is an example of a BV structure to which the bonding quality test circuit according to some embodiments may be applied. The memory device 800 of FIG. 22 may correspond to the memory device 120 of FIGS. 12 and 14.

Referring to FIG. 22, the memory device 800 may be implemented by manufacturing each of at least one upper chip including the cell area CELL and a lower chip implemented with a semiconductor layer including the peripheral circuit area PERI, and then connecting the at least one upper chip and the lower chip to each other by a bonding method. For example, the bonding method may refer to a method of electrically or physically connecting the bonding metal pattern formed on the uppermost metal layer of the at least one upper chip and the bonding metal pattern formed on the uppermost metal layer of the lower chip to each other. For example, when the bonding metal patterns are formed of copper (Cu), the bonding method may be a Cu—Cu bonding method. As another example, the bonding metal patterns may also be formed of aluminum (Al) or tungsten (W). The bonding quality test method and the bonding quality test circuit according to some embodiments may detect a state of an electrical connection between bonding metals provided in each of the upper chip and the lower chip.

The memory device 800 may include at least one upper chip including a cell area. For example, as illustrated in FIG. 22, the memory device 800 may be implemented to include two upper chips. However, this is exemplary, and the number of upper chips is not limited thereto. When the memory device 800 is implemented to include two upper chips, the memory device 800 may be manufactured by manufacturing a first upper chip including a first cell area CELL1, a second upper chip including a second cell area CELL2, and the lower chip including the peripheral circuit area PERI, and then connecting the first upper chip, the second upper chip, and the lower chip to each other by using a bonding method. The first upper chip may be reversed and connected to the lower chip by the bonding method, and the second upper chip may also be reversed and connected to the first upper chip by the bonding method. In the following description, upper and lower portions of the first and second upper chips are defined based on the state before the first upper chip and the second upper chip are inverted. That is, in FIG. 22, the upper portion of the lower chip means the upper portion defined based on the +D3 axis direction, and the upper portion of each of the first and second upper chips means the upper portion defined based on the −D3 axis direction. However, this is exemplary, and only one of the first upper chip and the second upper chip may be inverted and connected by the bonding method.

Each of the peripheral circuit area PERI and the first and second cell areas CELL1 and CELL2 of the memory device 800 may include an external pad bonding area PA, a word line bonding area WLBA, and a bit line bonding area BLBA.

The peripheral circuit area PERI may include a first substrate 810 and a plurality of circuit elements 820a, 820b, and 820c formed on the first substrate 810. An interlayer insulating layer 815 including one or more insulating layers may be provided on the plurality of circuit elements 820a, 820b, and 820c, and a plurality of metal wires connecting the plurality of circuit elements 820a, 820b, and 820c may be provided in the interlayer insulating layer 815. For example, the plurality of metal wires may include first metal wires 830a, 830b, and 830c connected to the plurality of circuit elements 820a, 820b, and 820c, respectively, and second metal wires 840a, 840b, and 840c formed on the first metal wires 830a, 830b, and 830c, respectively. The plurality of metal wires may be formed of at least one of various conductive materials. For example, the first metal wires 830a, 830b, and 830c may be formed of tungsten having relatively high electrical resistivity, and the second metal wires 840a, 840b, and 840c may be formed of copper having relatively low electrical resistivity.

In FIG. 22, only the first metal wires 830a, 830b, and 830c and the second metal wires 840a, 840b, and 840c are illustrated and described, but the present disclosure is not limited thereto, and at least one additional metal wire may also be further formed on the second metal wires 840a, 840b, and 840c. In this case, the second metal wires 840a, 840b, and 840c may be formed of aluminum. In addition, at least some of the additional metal wires formed on the second metal wires 840a, 840b, and 840c may be formed of copper and the like having lower electrical resistivity than that of aluminum of the second metal wires 840a, 840b, and 840c.

The interlayer insulating layer 815 may be disposed on the first substrate 810 and may include an insulating material, such as silicon oxide or silicon nitride.

Each of the first and second cell areas CELL1 and CELL2 may include at least one memory block. The first cell area CELL1 may include the second substrate 310 and the common source line 320. A plurality of word lines 331 to 338 (330) may be stacked on the second substrate 310 along the direction (D3 axis direction) perpendicular to the top surface of the second substrate 310. String select lines and a ground select line may be disposed above and below the word lines 330, and the plurality of word lines 330 may be disposed between the string select lines and the ground select line. Similarly, the second cell area CELL2 may include a third substrate 410 and a common source line 420, and a plurality of word lines 431 to 438 (430) may be stacked in the direction (D3 axis direction) perpendicular to the top surface of the third substrate 410. The second substrate 310 and the third substrate 410 may be made of various materials, and for example, the second substrate 310 and the third substrate 410 may be a silicon substrate, a silicon-germanium substrate, a germanium substrate, or a substrate having a monocrystalline epitaxial layer grown on a monocrystalline silicon substrate. A plurality of channel structures CH may be formed in each of the first and second cell areas CELL1 and CELL2.

In some embodiments, as illustrated in A1, the channel structure CH is provided in the bit line bonding area BLBA, and may extend in a direction perpendicular to the top surface of the second substrate 310 (e.g., the third direction D3) and may pass or extend through the word lines 330, the string select lines, and the ground select line. The channel structure CH may include a data storage layer, a channel layer, and a buried insulating layer. The channel layer may be electrically connected to the first metal wire 350c and the second metal wire 360c in the bit line bonding area BLBA. For example, the second metal wire 360c may be a bit line and may be connected to the channel structure CH through the first metal wire 350c. The bit line 360c may extend along a second direction (D2 axis direction) parallel to the top surface of the second substrate 310.

In some embodiments, as illustrated in A2, the channel structure CH may also include a lower channel LCH and an upper channel UCH which are connected to each other. For example, the channel structure CH may be formed through a process for the lower channel LCH and a process for the upper channel UCH. The lower channel LCH may extend in a direction perpendicular to the top surface of the second substrate 310 (e.g., the third direction D3) and may pass or extend through the common source line 320 and the lower word lines 331 and 332. The lower channel LCH may include a data storage layer, a channel layer, a buried insulating layer, and the like, and may be connected to the upper channel UCH. The upper channel UCH may pass or extend through the upper word lines 333 to 338. The upper channel UCH may include a data storage layer, a channel layer, a buried insulating layer, and the like, and the channel layer of the upper channel UCH is electrically connected to the first metal wire 350c and the second metal wire 360c. As the length of the channel increases, it may be difficult to form a channel having a constant width due to process reasons. The memory device 800 according to some embodiments of the present disclosure may include a channel having improved width uniformity through the lower channel LCH and the upper channel UCH formed through a sequential process.

As illustrated in A2, when the channel structure CH is formed to include the lower channel LCH and the upper channel UCH, the word line positioned near the boundary between the lower channel LCH and the upper channel UCH may be a dummy word line. For example, the word lines 332 and 333 forming boundaries between the lower channel LCH and the upper channel UCH may be dummy word lines. In this case, data may not be stored in memory cells connected to the dummy word line. In some embodiments, the number of pages corresponding to the memory cells connected to the dummy word line may be less than the number of pages corresponding to the memory cells connected to the general word line. The voltage level applied to the dummy word line may be different from the voltage level applied to the general word line, and accordingly, the influence of the non-uniform channel width between the lower channel LCH and the upper channel UCH on the operation of the memory device may be reduced.

Meanwhile, in A2, the number of lower word lines 331 and 332 through which the lower channel LCH passes is smaller than the number of upper word lines 333 to 338 through which the upper channel UCH passes. However, this is exemplary, and the present disclosure is not limited thereto. As another example, the number of lower word lines through which the lower channel LCH passes may be equal to or greater than the number of upper word lines through which the upper channel UCH passes. In addition, the above-described structure and connection relationship of the channel structure CH disposed in the first cell area CELL1 may be equally applied to the channel structure CH disposed in the second cell area CELL2.

In the bit line bonding area BLBA, a first through electrode THV1 may be provided in the first cell area CELL1, and a second through electrode THV2 may be provided in the second cell area CELL2. As illustrated in FIG. 22, the first through electrode THV1 may pass or extend through the common source line 320 and the plurality of word lines 330. However, this is exemplary, and the first through electrode THV1 may further penetrate or extend into the second substrate 310. The first through electrode THV1 may include a conductive material. In some embodiments, the first through electrode THV1 may include a conductive material surrounded by an insulating material. The second through electrode THV2 may also be provided in the same shape and structure as the first through electrode THV1.

In some embodiments, the first through electrode THV1 and the second through electrode THV2 may be electrically connected through a first through metal pattern 372d and a second through metal pattern 472d. The first through metal pattern 372d may be formed on the lower end of the first upper chip including the first cell area CELL1, and the second through metal pattern 472d may be formed on the upper end of the second upper chip including the second cell area CELL2. The first through electrode THV1 may be electrically connected to the first metal wire 350c and the second metal wire 360c. A lower via 371d may be formed between the first through electrode THV1 and the first through metal pattern 372d, and an upper via 471d may be formed between the second through electrode THV2 and the second through metal pattern 472d. The first through metal pattern 372d and the second through metal pattern 472d may be connected by a bonding method.

In addition, in the bit line bonding area BLBA, an upper metal pattern 852 may be formed on the uppermost metal layer of the peripheral circuit area PERI, and an upper metal pattern 392 having the same shape as that of the upper metal pattern 852 may be formed on the uppermost metal layer of the first cell area CELL1. The upper metal pattern 392 of the first cell area CELL1 and the upper metal pattern 852 of the peripheral circuit area PERI may be electrically connected to each other by a bonding method. In the bit line bonding area BLBA, the bit line 360c may be electrically connected to a page buffer included in the peripheral circuit area PERI. For example, some of the circuit elements 820c of the peripheral circuit area PERI may provide a page buffer, and the bit line 360c may be electrically connected to the circuit elements 820c providing the page buffer through the upper bonding metal 370c of the first cell area CELL1 and the upper bonding metal 870c of the peripheral circuit area PERI. The bonding quality test circuit according to some embodiments may test the bonding quality between the upper bonding metal 370c and the upper bonding metal 870c. Since the specific test method is the same as that previously described, the description thereof is omitted.

Referring to FIG. 22, in the word line bonding area WLBA, the word lines 330 of the first cell area CELL1 may extend in the first direction (D1 axis direction) parallel to the top surface of the second substrate 310 and be connected to the plurality of cell contact plugs 341 to 347 (340). A first metal wire 350b and a second metal wire 360b may be sequentially connected to upper portions of the cell contact plugs 340 connected to the word lines 330. The cell contact plugs 340 may be connected to the peripheral circuit area PERI through an upper bonding metal 370b of the first cell area CELL1 and the upper bonding metal 870b of the peripheral circuit area PERI in the word line bonding area WLBA.

The cell contact plugs 340 may be electrically connected to a row decoder included in the peripheral circuit area PERI. For example, some of the circuit elements 820b of the peripheral circuit area PERI provide a row decoder, and the cell contact plugs 340 may be electrically connected to the circuit elements 820b providing the row decoder through the upper bonding metal 370b of the first cell area CELL1 and the upper bonding metal 870b of the peripheral circuit area PERI. In some embodiments, the operating voltage of the circuit elements 820b providing the row decoder may be different from the operating voltages of the circuit elements 820c providing the page buffer. For example, the operating voltages of circuit elements 820c providing the page buffer may be larger than the operating voltages of circuit elements 820b providing the row decoder.

Similarly, in the word line bonding area WLBA, the plurality of word lines 431 to 438 (430) of the second cell area CELL2 may extend along the first direction (D1 axis direction) parallel to the top surface of the third substrate 410, and may be connected to the plurality of cell contact plugs 441 to 447 (440). The cell contact plugs 440 may be connected to the peripheral circuit area PERI through the upper metal pattern of the second cell area CELL2, and the lower and upper metal pattern and the cell contact plug 348 of the first cell area CELL1.

In the word line bonding area WLBA, the upper bonding metal 370b may be formed in the first cell area CELL1 and the upper bonding metal 870b may be formed in the peripheral circuit area PERI. The upper bonding metal 370b of the first cell area CELL1 and the upper bonding metal 870b of the peripheral circuit area PERI may be electrically connected to each other by a bonding method. The upper bonding metal 370b and the upper bonding metal 870b may be formed of aluminum, copper, or tungsten. The bonding quality test circuit according to some embodiments may test the bonding quality between the upper bonding metal 370b and the upper bonding metal 870b. Since the specific test method is the same as that previously described, the description thereof is omitted.

In the external pad bonding area PA, a lower metal pattern 371e may be formed below the first cell area CELL1 and an upper metal pattern 472a may be formed above the second cell area CELL2. The lower metal pattern 371e of the first cell area CELL1 and the upper metal pattern 472a of the second cell area CELL2 may be connected by a bonding method in the external pad bonding area PA. Similarly, an upper metal pattern 372a may be formed on the first cell area CELL1, and an upper metal pattern 872a may be formed on the peripheral circuit area PERI. The upper metal pattern 372a of the first cell area CELL1 and the upper metal pattern 872a of the peripheral circuit area PERI may be connected by a bonding method.

Common source line contact plugs 380 and 480 may be disposed in the external pad bonding area PA. The common source line contact plugs 380 and 480 may be formed of a conductive material such as metal, metal compound, or doped polysilicon. The common source line contact plug 380 of the first cell area CELL1 may be electrically connected to the common source line 320, and the common source line contact plug 480 of the second cell area CELL2 may be electrically connected to the common source line 420. A first metal wire 350a and a second metal wire 360a are sequentially stacked on the upper portion of the common source line contact plug 380 of the first cell area CELL1, and a first metal wire 450a and a second metal wire 460a may be sequentially stacked on the upper portion of the common source line contact plug 480 of the second cell area CELL2.

Input/output pads 805, 405, and 406 may be disposed in the external pad bonding area PA. A lower insulating layer 801 may cover or be on the lower surface of the first substrate 810, and a first input/output pad 805 may be formed on the lower insulating layer 801. The first input/output pad 805 may be connected to at least one of the plurality of circuit elements 820a, 820b, and 820c disposed in the peripheral circuit area PERI through the first input/output contact plug 803, and may be separated from the first substrate 810 by the lower insulating layer 801. In addition, a side insulating layer may be disposed between the first input/output contact plug 803 and the first substrate 810 to electrically separate or insulate the first input/output contact plug 803 from the first substrate 810.

An upper insulating layer 401 covering or on the top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 820a, 820b, and 820c disposed in the peripheral circuit area PERI through the second input/output contact plugs 403 and 303, and the third input/output pad 406 may be connected to at least one of the plurality of circuit elements 820a, 820b, and 820c disposed in the peripheral circuit area PERI through the third input/output contact plugs 404 and 304.

In some embodiments, the third substrate 410 may not be disposed in the region where the input/output contact plugs are disposed. For example, the third input/output contact plug 404 may be separated from the third substrate 410 in a direction parallel to the top surface of the third substrate 410 (e.g., the first direction D1) and may pass or extend through the interlayer insulating layer 415 of the second cell area CELL2 and may be connected to the third input/output pad 406. In this case, the third input/output contact plug 404 may be formed through various processes.

For example, as illustrated in B1, the third input/output contact plug 404 may extend in a third direction (D3 direction) and may have a larger diameter toward the upper insulating layer 401. That is, while the diameter of the channel structure CH described in A1 is formed to decrease toward the upper insulating layer 401, the diameter of the third input/output contact plug 404 may be formed to increase toward the upper insulating layer 401. For example, the third input/output contact plug 404 may be formed after the second cell area CELL2 and the first cell area CELL1 are bonded together by a bonding method.

Also, for example, as illustrated in B2, the third input/output contact plug 404 may extend in the third direction (D3 direction) and may have a smaller diameter toward the upper insulating layer 401. That is, the diameter of the third input/output contact plug 404 may be formed to decrease toward the upper insulating layer 401 like the channel structure CH. For example, the third input/output contact plug 404 may be formed together with the cell contact plugs 440 before the second cell area CELL2 and the first cell area CELL1 are bonded together.

In some embodiments, the input/output contact plug may be disposed to overlap the third substrate 410. For example, the second input/output contact plug 403 may be formed to pass or extend through the interlayer insulating layer 415 of the second cell area CELL2 in the third direction (D3 direction), and may be electrically connected to the second input/output pad 405 through the third substrate 410. In this case, the connection structure between the second input/output contact plug 403 and the second input/output pad 405 may be implemented in various ways.

For example, as illustrated in C1, an opening 408 penetrating or in the third substrate 410 may be formed, and the second input/output contact plug 403 may be directly connected to the second input/output pad 405 through the opening 408 formed in the third substrate 410. In this case, as illustrated in C1, the diameter of the second input/output contact plug 403 may be formed to increase toward the second input/output pad 405. However, this is exemplary, and the diameter of the second input/output contact plug 403 may also be formed to decrease toward the second input/output pad 405.

For example, as illustrated in C2, an opening 408 penetrating or in the third substrate 410 may be formed, and a contact 407 may be formed in the opening 408. One end of the contact 407 may be connected to the second input/output pad 405 and the other end may be connected to the second input/output contact plug 403. Accordingly, the second input/output contact plug 403 may be electrically connected to the second input/output pad 405 through the contact 407 in the opening 408. In this case, as illustrated in C2, the diameter of the contact 407 may be formed to increase toward the second input/output pad 405, and the diameter of the second input/output contact plug 403 may be formed to decrease toward the second input/output pad 405. For example, the third input/output contact plug 403 may be formed together with the cell contact plugs 440 before the second cell area CELL2 and the first cell area CELL1 are bonded together, and the contact 407 may be formed after the second cell area CELL2 and the first cell area CELL1 are bonded together.

Also, for example, as illustrated in C3, a stopper 409 may be further formed on the top surface of the opening 408 of the third substrate 410 as compared to C2. The stopper 409 may be a metal wire formed on the same layer as the common source line 420. However, this is exemplary, and the stopper 409 may also be a metal wire formed on the same layer as at least one of the word lines 430. The second input/output contact plug 403 may be electrically connected to the second input/output pad 405 through the contact 407 and the stopper 409.

Meanwhile, similar to the second and third input/output contact plugs 403 and 404 of the second cell area CELL2, each of the second and third input/output contact plugs 303 and 304 of the first cell area CELL1 may be formed to have the smaller diameter toward the lower metal pattern 371e or to have the larger diameter toward the lower metal pattern 371e.

Meanwhile, according to some embodiments, a slit 411 may be formed in the third substrate 410. For example, the slit 411 may be formed at an arbitrary position of the external pad bonding area PA. For example, the slit 411 may be located between the second input/output pad 405 and the cell contact plugs 440 when viewed from a plan view. However, this is exemplary, and the slit 411 may also be formed such that the second input/output pad 405 is positioned between the slit 411 and the cell contact plugs 440 when viewed from a plan view.

For example, as illustrated in D1, the slit 411 may be formed to pass or extend through the third substrate 410. The slit 411 may be used, for example, to prevent the third substrate 410 from being minutely cracked when forming the opening 408. However, this is exemplary, and the slit 411 may also be formed to a depth of about 60 to 70% of the thickness of the third substrate 410.

Also, for example, as illustrated in D2, a conductive material 412 may be formed in the slit 411. The conductive material 412 may be used, for example, to discharge leakage current generated during driving of circuit elements within the external pad bonding area PA to the outside. In this case, the conductive material 412 may be connected to an external ground line.

Also, for example, as illustrated in D3, an insulating material 413 may be formed in the slit 411. The insulating material 413 may be formed, for example, to electrically separate or insulate the second input/output pad 405 and the second input/output contact plug 403 disposed in the external pad bonding area PA from the word line bonding area WLBA. By forming the insulating material 413 in the slit 411, the voltage provided through the second input/output pad 405 may be prevented from affecting the metal layer disposed on the third substrate 410 in the word line bonding area WLBA.

Meanwhile, according to some embodiments, the first to third input/output pads 805, 405, and 406 may be selectively formed. For example, the memory device 800 may be implemented to include only the first input/output pad 805 disposed on the first substrate 810, only the second input/output pad 405 disposed on the third substrate 410, or only the third input/output pad 406 disposed on the upper insulating layer 401.

Meanwhile, according to some embodiments, at least one of the second substrate 310 of the first cell area CELL1 and the third substrate 410 of the second cell area CELL2 may be used as a sacrificial substrate, and may be completely or partially removed before or after the bonding process. An additional film may be deposited after the removal of the substrate. For example, the second substrate 310 of the first cell area CELL1 may be removed before or after bonding of the peripheral circuit area PERI and the first cell area CELL1, and an insulating layer covering the top surface of the common source line 320 or a conductive layer for connection may be formed. Similarly, the third substrate 410 of the second cell area CELL2 may be removed before or after bonding of the first cell area CELL1 and the second cell area CELL2, and the upper insulating layer 401 covering the top surface of the common source line 420 or a conductive layer for connection may be formed.

The channel layer of the second cell area CELL2 may be electrically connected to the first metal wire 450c and the second metal wire 460c in the bit line bonding area BLBA. For example, the second metal wire 460c may be a bit line and may be connected to the channel structure CH through the first metal wire 450c. The bit line 460c may extend along the second direction (D2 axis direction) parallel to the top surface of the third substrate 410. Although not illustrated in FIG. 22, an upper bonding metal (corresponding to 870c) connected to some page buffer circuits in the peripheral circuit area PERI may be connected to an upper bonding metal (corresponding to 370c of CELL1) connected to the bit line 460c. The bonding quality test circuit according to some embodiments may test a bonding quality of the upper bonding metals between the second cell area CELL2 and the page buffer circuit. Since the specific test method is the same as that previously described, the description thereof is omitted.

Figure 23:
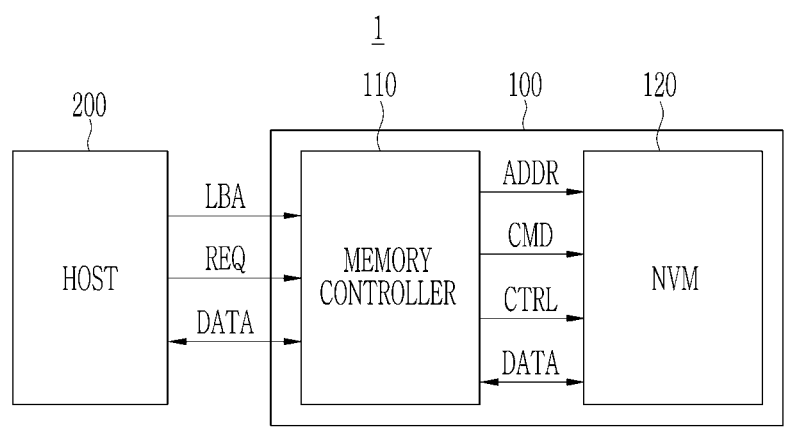
FIG. 23 is a block diagram illustrating an electronic device according to some embodiments.

FIG. 23 is a block diagram illustrating an electronic device according to some embodiments.

As illustrated in FIG. 23, the electronic device 1 may include a memory storage device 100 and a host 200. The host 200 and the memory storage device 100 may be electrically connected to each other and may transmit/ receive signals to each other through an interface configuration provided in each of the host 200 and the memory storage device 100. The host 200 may provide data DATA, a logical block address LBA corresponding to the data DATA, and a request signal REQ instructing a memory operation for the corresponding data to the memory storage device 100, and the memory storage device 100 may provide the data DATA obtained according to the memory operation to the host 200 in response to the request signal REQ. The host 200 may include, for example, a personal computer (PC), a laptop, a mobile phone, a smart phone, a tablet PC, a server, and the like.

A description of the memory storage device 100 is omitted because it overlaps with that of previous embodiments.

Although example embodiments of the present disclosure have been described in detail, the scope of the present disclosure is not limited by the example embodiments. Various changes and modifications using the basic concept of the present disclosure defined in the accompanying claims by those skilled in the art are within the scope of the present disclosure.

What is claimed is:

1. A bonding quality test circuit configured to test a bonding between a line provided to a memory device and a peripheral circuit that drives the memory device, the bonding quality test circuit comprising:
   a switching circuit configured to provide an electrical connection between a sensing node and a bonding node, the bonding node corresponding to a first end of a bonding resistor that is between the line and the peripheral circuit;
   a precharging circuit configured to provide a precharge voltage to the line and the sensing node when the precharging circuit is electrically connected to the line and the sensing node by the switching circuit;
   a latch circuit that includes a first node configured to provide a control output signal to the precharging circuit and a second node configured to have a voltage that is phase inverted with respect to a voltage of the control output signal; and
   a first transistor configured to provide an output signal according to the sensing node when the first transistor is electrically connected to the second node of the latch circuit.

2. The bonding quality test circuit of claim 1, further comprising:
   a second transistor electrically connected between the first end of the bonding resistor and the bonding node; and
   a third transistor electrically connected between the bonding node and a ground.

3. The bonding quality test circuit of claim 2, wherein, when the switching circuit electrically connects the precharging circuit, the bonding node, and the sensing node to each other in a state where the second transistor is on and the third transistor is off, the precharging circuit is configured to provide the precharge voltage to the line and the sensing node.

4. The bonding quality test circuit of claim 3, wherein, when the switching circuit blocks the precharging circuit from the bonding node and the sensing node and electrically connects the bonding node to the sensing node in a state where the second transistor is off and the third transistor is on, the sensing node is configured to discharge.

5. The bonding quality test circuit of claim 4, wherein, after the sensing node is discharged, the second transistor is configured to turn on and the third transistor is configured to turn off such that the sensing node and the first end of the bonding resistor are electrically connected, and
   wherein, after the second transistor is turned on and the third transistor is turned off, the first transistor is configured to provide the output signal according to a voltage of the sensing node.

6. The bonding quality test circuit of claim 1, wherein the line of the memory device is a bit line or a cell contact plug-in electrically connected to a word line of the memory device.

7. The bonding quality test circuit of claim 1, wherein the memory device is on a first semiconductor layer, and the peripheral circuit is on a second semiconductor layer, and
   wherein the bonding quality test circuit is in the second semiconductor layer.

8. The bonding quality test circuit of claim 7, wherein the bonding quality test circuit is configured to operate before a memory cell is formed in the first semiconductor layer.

9. A memory device, comprising:
   a first semiconductor layer that includes a plurality of memory cells and a bit line electrically connected to one or more of the plurality of memory cells; and
   a second semiconductor layer that includes a page buffer circuit electrically connected to the bit line through a bonding metal,
   wherein the page buffer circuit comprises:
   a switching circuit configured to provide an electrical connection between a sensing node and a bonding node, the bonding node corresponding to a first end of the bonding metal;
   a precharging circuit configured to provide a precharge voltage to the bit line and the sensing node when the precharging circuit is electrically connected to the bit line and the sensing node by the switching circuit;
   a latch circuit that includes a first node configured to provide a control output signal to the precharging circuit and a second node configured to have a voltage that is phase inverted with respect to a voltage of the control output signal; and
   a first transistor configured to provide an output signal according to the sensing node when the first transistor is electrically connected to the second node of the latch circuit.

10. The memory device of claim 9, wherein the page buffer circuit further comprises:
    a second transistor electrically connected between the first end of the bonding metal and the bonding node; and
    a third transistor electrically connected between the bonding node and a ground.

11. The memory device of claim 10, wherein, when the switching circuit electrically connects the precharging circuit, the bonding node, and the sensing node to each other in a state where the second transistor is on and the third transistor is off, the precharging circuit is configured to provide the precharge voltage to the bit line and the sensing node.

12. The memory device of claim 11, wherein, when the switching circuit blocks the precharging circuit from the bonding node and the sensing node and electrically connects the bonding node to the sensing node in a state where the second transistor is off and the third transistor is on, the sensing node is configured to discharge.

13. The memory device of claim 12, wherein, after the sensing node is discharged, the second transistor is configured to turn on and the third transistor is configured to turn off such that the sensing node and the first end of the bonding metal are electrically connected.

14. The memory device of claim 13, wherein, after the second transistor is turned on and the third transistor is turned off, the first transistor is configured to provide the output signal according to a voltage of the sensing node.

15. The memory device of claim 9, further comprising a control logic circuit configured to:
- receive an erase command as a defense code for a block that includes the plurality of memory cells;
- control the page buffer circuit to electrically connect the bonding node and the sensing node to the precharging circuit during a precharging period;
- discharge the sensing node during a discharging period after the precharging period; and
- electrically connect the bonding metal to the bonding node and electrically connect the bonding node to the sensing node after the discharging period.

16. The memory device of claim 15, wherein an operation cycle of the block includes an erase operation performed on the block based on the erase command, and
- wherein a number of times of the operation cycle of the block is based on a predetermined operation limit cycle.

17. The memory device of claim 15, wherein, when a bonding quality of the bonding metal is in a normal state, the bit line is configured to share a charge with the sensing node after the discharging period and the first transistor is configured to provide the output signal at a first voltage level, and
- wherein, when the bonding quality of the bonding metal is in an abnormal state, the first transistor is configured to provide the output signal at a second voltage level different from the first voltage level.

18. A method of testing bonding of layers of a memory device, the layers comprising a first semiconductor layer on which a memory cell is formed and a second semiconductor layer bonded to the first semiconductor layer by a bonding metal and on which a peripheral circuit for driving the memory cell is formed, the method comprising:
- receiving an erase command for a block including a plurality of memory cells;
- determining whether a number of times of an operation cycle of the block has reached a predetermined operation limit cycle;
- electrically connecting, when the number of times of the operation cycle of the block reaches the operation limit cycle, a sensing node to a bonding node and providing a precharge voltage to the sensing node and the bonding node during a precharging period, the bonding node corresponding to a first end of the bonding metal;
- discharging the sensing node during a discharging period after the precharging period; and
- electrically connecting the bonding node and the bonding metal and electrically connecting the bonding node and the sensing node after the discharging period.

19. The method of claim 18, wherein the discharging of the sensing node includes blocking the bonding node from the bonding metal.

20. The method of claim 18, further comprising determining a bonding quality of the bonding metal as a normal state or an abnormal state based on an output signal generated according to a voltage of the sensing node after the discharging period.

* * * * *